United States Patent
Shibahara et al.

(10) Patent No.: US 7,528,683 B2
(45) Date of Patent: May 5, 2009

(54) BALANCED ACOUSTIC WAVE FILTER DEVICE

(75) Inventors: Teruhisa Shibahara, Kanazawa (JP); Seiichi Takahara, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 540 days.

(21) Appl. No.: 10/570,371

(22) PCT Filed: Jul. 1, 2005

(86) PCT No.: PCT/JP2005/012207

§ 371 (c)(1),
(2), (4) Date: Mar. 2, 2006

(87) PCT Pub. No.: WO2006/067884

PCT Pub. Date: Jun. 29, 2006

(65) Prior Publication Data

US 2008/0246552 A1    Oct. 9, 2008

(30) Foreign Application Priority Data

Dec. 20, 2004  (JP) .............................. 2004-368244
Jan. 28, 2005  (JP) .............................. 2005-021623

(51) Int. Cl.
*H03H 9/00* (2006.01)
*H03H 9/25* (2006.01)
*H03H 9/42* (2006.01)

(52) U.S. Cl. ...................................... 333/193; 333/195
(58) Field of Classification Search ................. 333/133, 333/193, 195, 196
See application file for complete search history.

(56) References Cited

U.S. PATENT DOCUMENTS 6,037,847 A    3/2000  Ueda et al.

(Continued)

FOREIGN PATENT DOCUMENTS

JP    3-129915    6/1991

(Continued)

OTHER PUBLICATIONS

International Search Report for PCT Application No. PCT/JP2005/012207, mailed Oct. 25, 2005.

(Continued)

*Primary Examiner*—Dean O Takaoka
(74) *Attorney, Agent, or Firm*—Keating & Bennett, LLP

(57) ABSTRACT

A surface acoustic wave filter device includes an unbalanced terminal, first and second balanced terminals, and first, second and third IDTs. One end of the first IDT and one end of the third IDT are connected to the unbalanced terminal. The second IDT includes first and second divided IDT portions obtained by dividing the IDT in the surface wave propagating direction. The first and second divided IDT portions include sub-divided IDT portions and sub-divided IDT portions obtained by dividing the first and second divided IDT portions and in the crossing width direction. The first and second divided IDT portions are electrically connected in series. The first and second sub-divided IDT portions are electrically connected in series. The first and second sub-divided IDT portions are electrically connected in series. The second sub-divided IDT portion is connected to the first balanced terminal and the second sub-divided IDT portion is connected to the second balanced terminal.

53 Claims, 13 Drawing Sheets

U.S. PATENT DOCUMENTS

| | | |
|---|---|---|
| 6,353,372 B1 | 3/2002 | Baier et al. |
| 6,759,928 B2 * | 7/2004 | Endou et al. ............... 333/193 |
| 6,815,868 B2 | 11/2004 | Shibata et al. |
| 7,429,905 B2 * | 9/2008 | Shibahara ................ 333/193 |
| 2002/0079988 A1 | 6/2002 | Endou et al. |
| 2004/0080385 A1 | 4/2004 | Takamine et al. |

FOREIGN PATENT DOCUMENTS

| | | |
|---|---|---|
| JP | 05-218787 | 8/1993 |
| JP | 09-167936 | 6/1997 |
| JP | 2000-91883 | 3/2000 |
| JP | 2001-292050 | 10/2001 |
| JP | 2001-313540 | 11/2001 |
| JP | WO 02/03549 | 1/2002 |
| JP | 2002-171155 | 6/2002 |
| JP | 2002-290203 | 10/2002 |
| JP | 2002-300005 | 10/2002 |
| JP | 2003-69383 | 3/2003 |
| JP | 2003-087081 | 3/2003 |
| JP | 2004-096244 | 3/2004 |
| JP | 2004-96349 | 3/2004 |

OTHER PUBLICATIONS

Official communication issued in counterpart Chinese Application No. 200580000788.5, issued on Jun. 6, 2008.

Official communication issued in the corresponding Korean Application No. 10-2006-7003705, mailed on Dec. 15, 2006.

Official communication issued in counterpart Japanese Application No. 2006-548689, mailed on Nov. 11, 2008.

* cited by examiner

BALANCED ACOUSTIC WAVE FILTER DEVICE

BACKGROUND OF THE INVENTION

1. Field of the Invention

The present invention relates to a balanced acoustic wave filter device having a balanced-unbalanced conversion function.

2. Description of the Related Art

At a front end of a mobile communication apparatus, a surface acoustic wave filter is connected between an antenna and a differential amplifier to define a bandpass filter. The antenna inputs and outputs unbalanced signals while the differential amplifier inputs and outputs balanced signals. Accordingly, a component having a balanced-unbalanced conversion function must be connected between the antenna and the differential amplifier. If the surface acoustic wave filter has a balanced-unbalanced conversion function, the need for another component having a balanced-unbalanced conversion function, such as a balun, is eliminated.

The characteristic impedance of the antenna is about 50Ω while the characteristic impedance of the differential amplifier is greater than or equal to about 100Ω, and in some situations, it reaches about 1,000Ω. Therefore, between the antenna and the differential amplifier, impedance conversion is required in addition to balanced-unbalanced conversion. Consequently, it is desirable that a surface acoustic wave filter having the balanced-unbalanced conversion also has the impedance conversion function.

Japanese Unexamined Patent Application Publication No. 2003-69383 (Patent Document 1) described below discloses a surface acoustic wave filter device shown in FIG. 16. A surface acoustic wave filter device 201 includes electrodes having a structure shown in FIG. 16 that are provided on a piezoelectric substrate 202. The surface acoustic wave filter device 201 includes an unbalanced terminal 203 and first and second balanced terminals 204 and 205. First to third IDTs 211 to 213 are arranged in a surface wave propagating direction. Reflectors 214 and 215 are arranged on either side of an area in which the IDTs 211 to 213 are arranged in a surface wave propagating direction.

The second middle IDT 212 is divided into two pieces in a surface wave propagating direction so as to include first and second divided IDT portions 212a and 212b. The unbalanced terminal 203 is connected to one end of the first IDT 211 and one end of the third IDT 213, while the other end of the IDT 211 and the other end of the IDT 213 are connected to ground. Additionally, the first and second divided IDT portions 212a and 212b are connected to the first and second balanced terminals 204 and 205, respectively.

The above-described surface acoustic wave filter device 201 has a balanced-unbalanced conversion function and further has an impedance conversion function. That is, the second IDT 212 is divided into the first and second divided IDT portions 212a and 212b, which are electrically connected in series. Accordingly, the impedance of the second IDT 212 is four times the impedance of an IDT before being divided into the first and second divided IDT portions 212a and 212b. Accordingly, in the surface acoustic wave filter device 201, the impedance ratio of the unbalanced terminal 203 to the balanced terminal 204 or 205 is about 1:4.

As described above, it is strongly desired for a surface acoustic wave filter connected between an antenna and a differential amplifier to have an impedance conversion function in addition to a balanced-unbalanced conversion function. As stated above, the surface acoustic wave filter device 201 discussed in Patent Document 1 has an impedance ratio of about 1:4 between the unbalanced terminal 203 and the balanced terminal 204 or 205. Therefore, the surface acoustic wave filter device 201 has an approximately quadruple impedance conversion function.

However, nowadays, it is not uncommon that the characteristic impedance of the above-described differential amplifier exceeds about 1,000Ω. Accordingly, when, for example, the input and output impedance of an antenna is about 50Ω and the characteristic impedance of a differential amplifier is about 1000Ω, a 1:20 impedance conversion is required. Although the surface acoustic wave filter device 201 discussed in Patent Document 1 can increase the impedance to about four times the original impedance, the surface acoustic wave filter device 201 cannot achieve an impedance conversion function that increases the impedance to more than four times the original impedance.

Accordingly, if an impedance conversion function that increases the impedance to more than four times the original impedance is required, an additional component for impedance conversion is required in addition to the surface acoustic wave filter device 201.

In recent years, a boundary acoustic wave filter device that utilizes boundary acoustic waves has been used as an acoustic wave device in addition to a surface acoustic wave filter device. For other types of acoustic wave filter devices, such as a boundary acoustic wave filter device, a high-ratio impedance conversion function is also desired in addition to a balanced-unbalanced conversion function.

SUMMARY OF THE INVENTION

To overcome the problems described above, preferred embodiments of the present invention provide a balanced acoustic wave filter device that has not only a balanced-unbalanced conversion function but also a high-ratio impedance conversion function.

According to a first preferred embodiment, a balanced acoustic wave filter device having an unbalanced terminal and first and second balanced terminals and having a balanced-unbalanced conversion function includes a piezoelectric substrate and first to third IDTs disposed on the piezoelectric substrate in a surface wave propagating direction. The second IDT includes first and second divided IDT portions obtained by dividing the second IDT into two portions in the surface wave propagating direction, one of the ends of the first divided IDT portion is connected to one of the ends of the second divided IDT portion such that the first divided IDT portion is connected to the second divided IDT portion in series, the other end of the first divided IDT portion is connected to the first balanced terminal, and the other end of the second divided IDT portion is connected to the second balanced terminal. The first to third IDTs are arranged such that electrical signals flowing from the unbalanced terminal to the first balanced terminal and flowing from the unbalanced terminal to the second balanced terminal have a 180-degree phase difference. Each of the first and second divided IDT portions includes at least first and second sub-divided IDT portions obtained by dividing each of the first and second divided IDT portions into two in a crossing width direction that is substantially perpendicular to the surface wave propagating direction, and at least the first and second sub-divided IDT portions are electrically connected in series.

According to a specific aspect of the first preferred embodiment, the outermost electrode fingers of the first and third IDTs adjacent to the second IDT are connected to ground.

According to a second preferred embodiment, a balanced acoustic wave filter device having an unbalanced terminal and first and second balanced terminals and having a balanced-unbalanced conversion function includes a piezoelectric substrate and first and second longitudinally coupled resonator type acoustic wave filter portions provided on the piezoelectric substrate. The first acoustic wave filter portion includes first to third IDTs disposed in the acoustic wave propagating direction and the second acoustic wave filter portion includes fourth to sixth IDTs disposed in a surface wave propagating direction. The second IDT of the first acoustic wave filter portion is connected to the unbalanced terminal, the fourth IDT of the second acoustic wave filter portion is connected to the first IDT by a first interconnection line, and the third IDT is connected to the sixth IDT of the second acoustic wave filter portion by a second interconnection line. The fifth IDT includes first and second divided IDT portions obtained by dividing the fifth IDT into two in the acoustic wave propagating direction, one of the ends of the first divided IDT portion is connected to one of the ends of the second divided IDT portion in series, the other end of the first divided IDT portion is electrically connected to the first balanced terminal, and the other end of the second divided IDT portion is electrically connected to the second balanced terminal. The second IDT and the first and third IDTs are configured such that electrical signals flowing in the first interconnection line and flowing in the second interconnection line have a 180-degree phase difference. Each of the first and second divided IDT portions of the second acoustic wave filter portion includes at least first and second sub-divided IDT portions obtained by further dividing each of the first and second divided IDT portions into two in a crossing width direction that is substantially perpendicular to the acoustic wave propagating direction, and at least the first and second sub-divided IDT portions are electrically connected in series.

According to a specific aspect of the second preferred embodiment, the outermost electrode fingers of the fourth and sixth IDTs adjacent to the fifth IDT are connected to ground.

According to a third preferred embodiment, a balanced acoustic wave filter device having first and second balanced terminals and third and fourth balanced terminals includes a piezoelectric substrate and first to third IDTs disposed on the piezoelectric substrate in a surface wave propagating direction. The second IDT includes first and second divided IDT portions obtained by dividing the second IDT into two in the surface wave propagating direction, one of the ends of the first divided IDT portion is connected to one of the ends of the second divided IDT portion so that the first divided IDT portion is connected to the second divided IDT portion in series, the other end of the first divided IDT portion is connected to the first balanced terminal, and the other end of the second divided IDT portion is connected to the second balanced terminal. The third balanced terminal is connected to the first IDT and the fourth balanced terminal is connected to the third IDT. Each of the first and second divided IDT portions includes at least first and second sub-divided IDT portions obtained by further dividing each of the first and second divided IDT portions into two in a crossing width direction that is substantially perpendicular to the surface wave propagating direction, and at least the first and second sub-divided IDT portions are electrically connected in series.

According to a specific aspect of the third preferred embodiment, the outermost electrode fingers of the first and third IDTs adjacent to the second IDT are connected to ground.

According to another specific aspect of the first to third preferred embodiments, each of the first and second divided IDT portions includes the first and second sub-divided IDT portions, the second sub-divided IDT portion of the first divided IDT portion is connected to the first balanced terminal, and the second sub-divided IDT portion of the second divided IDT portion is connected to the second balanced terminal. The balanced acoustic wave filter device further includes a first acoustic track allowing acoustic waves to propagate in the first sub-divided IDT portion, a second acoustic track allowing acoustic waves to propagate in the second sub-divided IDT portion, and means for adjusting the excitation strength of acoustic waves propagating on the first acoustic track to be substantially the same as the excitation strength of acoustic waves propagating on the second acoustic track.

According to a fourth preferred embodiment, a balanced acoustic wave filter device having an unbalanced terminal and first and second balanced terminals and having a balanced-unbalanced conversion function includes a piezoelectric substrate and first to third IDTs disposed on the piezoelectric substrate in a surface wave propagating direction. The second IDT is connected to the unbalanced terminal, one of the ends of the first IDT is connected to one of the ends of the third IDT such that the first IDT is connected to the third IDT in series, the other end of the first IDT is connected to the first balanced terminal, and the other end of the third IDT is connected to the second balanced terminal. The first to third IDTs are arranged such that electrical signals flowing from the unbalanced terminal to the first balanced terminal and flowing from the unbalanced terminal to the second balanced terminal have a 180-degree phase difference. Each of the first and third IDTs includes at least first and second sub-divided IDT portions obtained by dividing each of the first and third divided IDTs into two in a crossing width direction that is substantially perpendicular to the surface wave propagating direction, and at least the first and second sub-divided IDT portions are electrically connected in series.

According to a specific aspect of the fourth preferred embodiment, a portion at which one end of the first IDT is connected to one end of the third IDT is connected to ground.

According to another specific aspect of the fourth preferred embodiment, the balanced acoustic wave filter device further includes a fourth IDT disposed outside the first IDT and connected to an unbalanced terminal and a fifth IDT disposed outside the third IDT and connected to an unbalanced terminal.

According to still another specific aspect of the fourth preferred embodiment, the outermost electrode fingers of the second IDT adjacent to the first and third IDTs are connected to ground.

According to still another specific aspect of the fourth preferred embodiment, the outermost electrode fingers of the fourth and fifth IDTs adjacent to the first and third IDTs are connected to ground.

According to still another specific aspect of the fourth preferred embodiment, the second sub-divided IDT portion of the first IDT is connected to the first balanced terminal, and the second sub-divided IDT portion of the third IDT is connected to the second balanced terminal. The balanced acoustic wave filter device further includes a first acoustic track allowing acoustic waves to propagate in the first sub-divided IDT portion, a second acoustic track allowing acoustic waves to propagate in the second sub-divided IDT portion, and means for adjusting the excitation strength of acoustic waves propagating on the first acoustic track to be substantially the same as the excitation strength of acoustic waves propagating on the second acoustic track.

According to still another specific aspect of the fourth preferred embodiment, the means for adjusting the excitation strength of acoustic waves propagating on the first acoustic track to be substantially the same as the excitation strength of acoustic waves propagating on the second acoustic track includes at least one of means for changing the excitation strength of acoustic waves propagating on the first acoustic track and means for changing the excitation strength of acoustic waves propagating on the second acoustic track.

According to another aspect of the fourth preferred embodiment, the means for changing the excitation strength on the first acoustic track preferably includes at least one of means for changing the excitation strength in a gap between the first sub-divided IDT portions and means for changing the excitation strength in a gap between the outer edge of the first sub-divided IDT portion in the surface wave propagating direction and the adjacent IDT.

According to still another specific aspect of the fourth preferred embodiment, the means for changing the excitation strength on the second acoustic track includes at least one of means for changing the excitation strength in a gap between the second sub-divided IDT portions and means for changing the excitation strength in a gap between the outer edge of the second sub-divided IDT portion in the surface wave propagating direction and the adjacent IDT.

According to another aspect of the fourth preferred embodiment, the means for adjusting the excitation strength on the first acoustic track to be substantially the same as the excitation strength on the second acoustic track includes means for weighting of an IDT. In this case, the weighting may include one of series weighting, thinning-out weighting, and crossing width weighting.

According to still another specific aspect of the fourth preferred embodiment, each of the first and second sub-divided IDT portions includes a narrow-pitch electrode finger portion, the narrow-pitch electrode finger portion includes a plurality of electrode fingers starting from an electrode finger adjacent to another IDT, and the cycle of the electrode fingers in the narrow-pitch electrode finger portion is less than the cycle of electrode fingers in the other portion. When the portion of the IDT other than the narrow-pitch electrode finger portion is referred to as a main portion, the means for changing the excitation strength on the first acoustic track includes at least one of means for changing the excitation strength in the narrow-pitch electrode finger portion and means for changing the excitation strength in the main portion.

According to still another specific aspect of the fourth preferred embodiment, each of the first and second sub-divided IDT portions includes a narrow-pitch electrode finger portion, the narrow-pitch electrode finger portion includes the certain number of electrode fingers starting from an electrode finger adjacent to another IDT, and the cycle of the electrode fingers in the narrow-pitch electrode finger portion is less than the cycle of electrode fingers in the other portion. When the portion of the IDT other than the narrow-pitch electrode finger portion is referred to as a main portion, the means for changing the excitation strength on the second acoustic track includes at least one of means for changing the excitation strength in the second sub-divided IDT narrow-pitch electrode finger filter and/or means for changing the excitation strength in the main portion.

In the balanced acoustic wave filter device according to the preferred embodiments of the present invention, the means for changing the excitation strength includes means for changing the metallization ratio of electrode fingers.

According to another preferred embodiment, the metallization ratio of electrode fingers on the first acoustic track is less than the metallization ratio of electrode fingers on the second acoustic track.

In the balanced acoustic wave filter device according to the first preferred embodiment, since the first to third IDTs are disposed such that electrical signals flowing from the unbalanced terminal to the first balanced terminal and flowing from the unbalanced terminal to the second balanced terminal have a 180-degree phase difference, the balanced acoustic wave filter device has a balanced-unbalanced conversion function. In addition, each of the first and second divided IDT portions includes first and second sub-divided IDT portions obtained by dividing each of the first and second divided IDT portions into two in a crossing width direction that is perpendicular to the surface wave propagating direction, and the first and second sub-divided IDT portions are electrically connected in series. Consequently, the ratio of the impedance of the unbalanced terminal to the impedance of the balanced terminal is about 1:16. That is, in addition to a known balanced surface acoustic wave filter device, a balanced acoustic wave filter having a high-ratio impedance conversion function is provided.

When the outermost electrode fingers of the first and third IDTs adjacent to the second IDT are connected to ground, the attenuation at an out-of-band frequency is improved. That is, when the first and second divided IDT portions are provided, the impedance between the first and second balanced terminals is increased. Accordingly, the level of direct arrival waves to the balanced terminal is increased as compared to a known structure even when the parasitic capacitance between the IDT connected to the balanced terminal and the IDT connected to the unbalanced terminal is equal to that in the known structure. Therefore, by connecting the outermost electrode fingers of the first and third IDTs to ground, the effect of the direct arrival waves is reduced, thereby improving the attenuation at an out-of-band frequency.

According to the first preferred embodiment, if the outermost electrode fingers of the first and third IDTs adjacent to the second IDT are connected to ground, the attenuation at an out-of-band frequency is further improved.

In the acoustic wave filter device according to the second preferred embodiment, the first and second acoustic wave filter portions are provided on the piezoelectric substrate, the second IDT of the first acoustic wave filter portion is connected to the unbalanced terminal, the fourth IDT of the second acoustic wave filter portion is connected to the first IDT by a first interconnection line, and the third IDT is connected to the sixth IDT of the second acoustic wave filter portion by a second interconnection line. Additionally, the second acoustic wave filter portion is configured in a similar manner as that of the balanced acoustic wave filter device according to the first preferred embodiment.

Accordingly, a balanced acoustic wave filter device having a balanced-unbalanced conversion function and a high-ratio impedance conversion function is provided such that the ratio of the impedance of the unbalanced terminal to the impedance of the balanced terminal is about 1:16. According to the second preferred embodiment, since the second acoustic wave filter portion is connected to the unbalanced terminal via the first acoustic wave filter portion, the attenuation at an out-of-band frequency is increased.

In particular, when the outermost electrode fingers of the fourth and sixth IDTs adjacent to the fifth IDT are connected to ground, the attenuation at an out-of-band frequency is further improved.

In the acoustic wave filter device according to the third preferred embodiment, the second IDT of the first to third IDTs disposed in the surface wave propagating direction includes first and second divided IDT portions, one of the ends of the first divided IDT portion is connected to one of the ends of the second divided IDT portion such that the first divided IDT portion is connected to the second divided IDT portion in series, the other end of the first divided IDT portion is connected to the first balanced terminal, and the other end of the second divided IDT portion is connected to the second balanced terminal. The third balanced terminal is connected to the first IDT and the fourth balanced terminal is connected to the third IDT. Each of the first and second divided IDT portions includes at least first and second sub-divided IDT portions obtained by further dividing each of the first and second divided IDT portions into two in a crossing width direction that is substantially perpendicular to the surface wave propagating direction, and at least the first and second sub-divided IDT portions are electrically connected in series.

Accordingly, a balanced acoustic wave filter device is provided in which the ratio of the impedance of the first or second balanced terminal to the impedance of the third or fourth balanced terminal is 1:16.

In the structure in which each of the first and second divided IDT portions includes the first and second sub-divided IDT portions, the second sub-divided IDT portion of the first divided IDT portion is connected to the first balanced terminal, and the second sub-divided IDT portion of the second divided IDT portion is connected to the second balanced terminal, a first acoustic track allowing acoustic waves to propagate in the first sub-divided IDT portion and a second acoustic track allowing acoustic waves to propagate in the second sub-divided IDT portion are formed. In this case, the excitation strength of acoustic waves propagating on the first acoustic track is different from the excitation strength of acoustic waves propagating on the second acoustic track. When means for bringing the excitation strength of acoustic waves propagating on the first acoustic track close to the excitation strength of acoustic waves propagating on the second acoustic track is further provided, a ripple that tends to appear in a passband is efficiently eliminated, and therefore, a more superior filter characteristic is obtained.

According to the fourth preferred embodiment, the first to third IDTs are disposed on the piezoelectric substrate. The second IDT is connected to the unbalanced terminal, one of the ends of the first IDT is connected to one of the ends of the third IDT such that the first IDT is connected to the third IDT in series, the other end of the first IDT is connected to the first balanced terminal, and the other end of the third IDT is connected to the second balanced terminal. The first to third IDTs are disposed such that electrical signals flowing from the unbalanced terminal to the first balanced terminal and flowing from the unbalanced terminal to the second balanced terminal have a 180-degree phase difference. Accordingly, an acoustic wave filter device having a balanced-unbalanced conversion function is provided.

In addition, since each of the first and third IDTs includes first and second sub-divided IDT portions and at least the first and second sub-divided IDT portions are electrically connected in series, the ratio of the impedance of the unbalanced terminal to the impedance of the balanced terminal is about 1:16. That is, a balanced acoustic wave filter device having a high-ratio impedance conversion function is provided.

According to the fourth preferred embodiment, when a portion at which one end of the first IDT is connected to one end of the third IDT is connected to ground, the attenuation at an out-of-band frequency is improved.

According to the fourth preferred embodiment, when the balanced acoustic wave filter device further includes a fourth IDT disposed outside the first IDT and connected to an unbalanced terminal and a fifth IDT disposed outside the third IDT and connected to an unbalanced terminal, a 5-IDT type balanced acoustic wave filter device is provided.

When the outermost electrode fingers of the second IDT adjacent to the first and third IDTs are connected to ground, the attenuation at an out-of-band frequency is increased.

Similarly, when the outermost electrode fingers of the fourth and fifth IDTs adjacent to the first and third IDTs are connected to ground, the attenuation at an out-of-band frequency is increased.

According to the fourth preferred embodiment, when means for bringing the excitation strength of acoustic waves propagating on the first acoustic track close to the excitation strength of acoustic waves propagating on the second acoustic track is further provided, a ripple that tends to appear in a passband is efficiently eliminated, and therefore, a more superior filter characteristic is obtained.

The means for adjusting the excitation strength of acoustic waves propagating on the first acoustic track to be substantially the same as the excitation strength of acoustic waves propagating on the second acoustic track can be achieved by a variety of structures. When the means includes at least one of means for changing the excitation strength of acoustic waves propagating on the first acoustic track and means for changing the excitation strength of acoustic waves propagating on the second acoustic track, a ripple appearing in a passband is efficiently eliminated by appropriately combining these means.

When the means for changing the excitation strength of acoustic waves on the first acoustic track includes at least one of means for changing the excitation strength in a gap between the first sub-divided IDTs and means for changing the excitation strength in a gap between the outer edge of the first sub-divided IDT portion in the surface wave propagating direction and the adjacent IDT, the excitation strength of acoustic waves on the first acoustic track is efficiently changed according to preferred embodiments of the present invention. Thus, the excitation strength of acoustic waves propagating on the first acoustic track is brought close to the excitation strength of acoustic waves propagating on the second acoustic track.

When the means for changing the excitation strength on the second acoustic track includes at least one of means for changing the excitation strength in a gap between the second sub-divided IDTs and means for changing the excitation strength in a gap between the outer edge of the second sub-divided IDT portion in the surface wave propagating direction and the adjacent IDT, the excitation strength of acoustic waves on the second acoustic track is efficiently changed. Thus, the excitation strength of acoustic waves propagating on the first acoustic track is reliably brought close to the excitation strength of acoustic waves propagating on the second acoustic track.

The means for increasing or decreasing the excitation strength of acoustic waves propagating on the first acoustic track and the excitation strength of acoustic waves propagating on the second acoustic track can be achieved by a variety of structures. In a structure in which weighting is applied to at least one electrode finger, the means may be achieved by a simple method in which at least one electrode finger is weighted by series weighting, thinning-out weighting, or crossing width weighting.

Additionally, when the means for changing the excitation strength of acoustic waves propagating on the first acoustic track includes at least one of means for changing the excitation strength in the narrow-pitch electrode finger portion of the first sub-divided IDT portion and means for changing the excitation strength in the main portion, a ripple that tends to appear in a passband is efficiently eliminated simply by providing a structure of the narrow-pitch electrode finger portion and/or the main portion such that the excitation strength in the narrow-pitch electrode finger portion of the first sub-divided IDT portion and/or the main portion.

Furthermore, when the means for changing the excitation strength of acoustic waves propagating on the second acoustic track includes at least one of means for changing the excitation strength in the narrow-pitch electrode finger portion of the second sub-divided IDT portion and means for changing the excitation strength in the main portion, a ripple that tends to appear in a passband is efficiently eliminated simply by providing a structure of the narrow-pitch electrode finger portion and/or the main portion such that the excitation strength in the narrow-pitch electrode finger portion and/or the main portion. The means for changing the excitation strength includes means for changing the metallization ratio of electrode fingers. That is, the excitation strength in the narrow-pitch electrode finger portion of the first sub-divided IDT portion and/or in the main portion or the excitation strength in the narrow-pitch electrode finger portion of the second sub-divided IDT portion and/or in the main portion can be changed by adjusting the metallization ratio of the electrode fingers of the sub-divided IDT portion. In particular, by decreasing the metallization ratio on the first acoustic track to a value less than the metallization ratio on the second acoustic track, a ripple that tends to appear in a passband is efficiently eliminated.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

The present invention will be described with reference to preferred embodiments of the present invention and to the accompanying drawings.

First Preferred Embodiment

Figure 1:
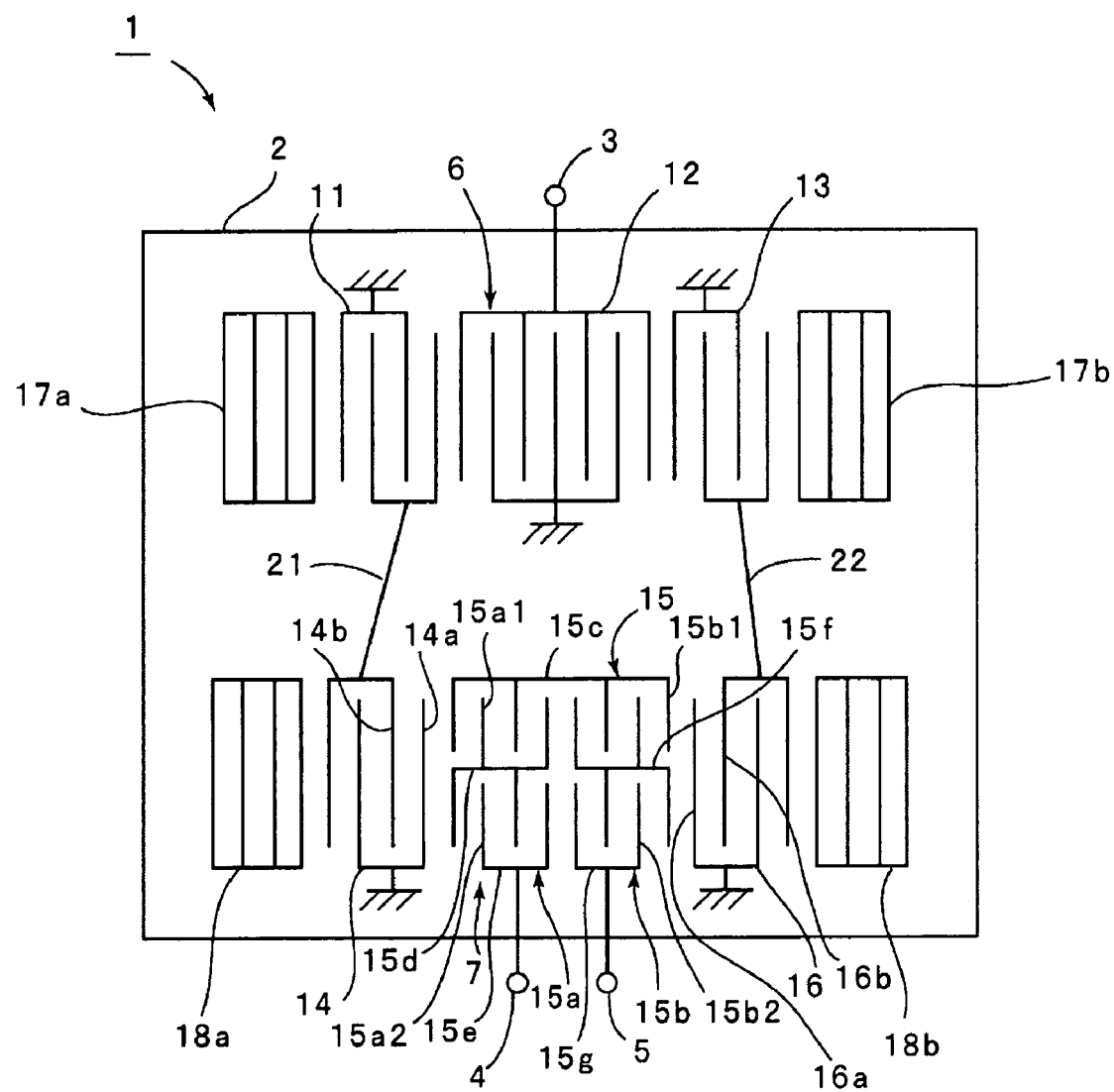
FIG. 1 is a schematic plan view of a surface acoustic wave filter device according to a preferred embodiment of the present invention.

FIG. 1 is a schematic plan view of a surface acoustic wave filter device according to a first preferred embodiment of the present invention.

A surface acoustic wave filter device 1 according to this preferred embodiment includes a piezoelectric substrate 2. In this preferred embodiment, the piezoelectric substrate 2 is preferably made of a $LiTaO_3$ substrate. However, the piezoelectric substrate 2 may be made of another piezoelectric single-crystal substrate including piezoelectric single crystal, such as $LiNbO_3$, or may be made of a piezoelectric ceramic substrate. Also, the piezoelectric substrate 2 preferably includes a piezoelectric thin film that is layered on a substrate made of a piezoelectric material or a substrate made of an insulating material.

The surface acoustic wave filter device 1 includes an unbalanced terminal 3 and first and second balanced terminals 4 and 5.

Additionally, on the piezoelectric substrate 2, a first longitudinally coupled resonator type surface acoustic wave filter portion 6 and a second longitudinally coupled resonator type surface acoustic wave filter portion 7 are provided.

In the longitudinally coupled resonator type surface acoustic wave filter portion 6, first to third IDTs 11 to 13 are arranged in a surface wave propagating direction. Reflectors 17a and 17b are arranged on either side of an area where the first to third IDTs 11 to 13 are arranged in the surface wave propagating direction. Accordingly, the surface acoustic wave filter portion 6 defines a 3-IDT longitudinally coupled resonator type surface acoustic wave filter.

One end of the second IDT 12 located in the middle of the surface acoustic wave filter portion 6 is connected to the unbalanced terminal 3 while the other end of the second IDT 12 is connected to ground. One end of the first IDT 11 and one end of the third IDT 13 are connected to ground while the other end of the first IDT 11 and the other end of the third IDT 13 are connected to the second longitudinally coupled resonator type surface acoustic wave filter portion 7. The phase of the first IDT 11 is different from that of the third IDT 13 by 180 degrees.

The second longitudinally coupled resonator type surface acoustic wave filter portion 7 includes fourth to sixth IDTs 14 to 16 arranged in a surface wave propagating direction. Reflectors 18a and 18b are arranged on either side of an area in which the fourth to sixth IDTs 14 to 16 are arranged in a surface wave propagating direction.

One end of the fourth IDT 14 and one end of the sixth IDT 16 are electrically connected to the first IDT 11 and the third IDT 13 of the surface acoustic wave filter portion 6 via first and second interconnection lines 21 and 22, respectively. The other end of the fourth IDT 14 and the other end of the sixth IDT 16 are connected to ground.

The fifth IDT 15 located in the middle of the longitudinally coupled resonator type surface acoustic wave filter portion 7 includes first and second divided IDT portions 15a and 15b obtained by dividing the fifth IDT 15 into two arranged in a surface wave propagating direction. The first and second divided IDT portions 15a and 15b are electrically connected in series by a bus bar 15c. The bus bar 15c may be connected to ground or may be electrically floated.

The first and second divided IDT portions 15a and 15b include first and second sub-divided IDT portions 15a1 and 15a2 and first and second sub-divided IDT portions 15b1 and 15b2, respectively, which are divided portions arranged in a crossing width direction, namely, in a direction that is substantially perpendicular to a surface wave propagating direction.

That is, the first and second sub-divided IDT portions 15a1 and 15a2 are arranged in the first divided IDT portion 15a in the crossing width direction. The first and second sub-divided IDT portions 15a1 and 15a2 are connected in series by a connection bus bar 15d that is common to the two sub-divided IDT portions. In the first divided IDT portion 15a, the first sub-divided IDT portion 15a1 is provided between the above-described bus bar 15c and the connection bus bar 15d. Additionally, the second sub-divided IDT portions 15a2 is provided between the connection bus bar 15d and a divided bus bar 15e which faces the bus bar 15c across the connection bus bar 15d. The divided bus bar 15e is connected to the first balanced terminal 4.

Similarly, in the second divided IDT portion 15b, the first sub-divided IDT portion 15b1 is provided between the bus bar 15c and a connection bus bar 15f. Additionally, the second sub-divided IDT portion 15b2 is provided between the connection bus bar 15f and a divided bus bar 15g which faces the bus bar 15c across the connection bus bar 15f. The divided bus bar 15g is connected to the second balanced terminal 5.

According to this preferred embodiment, as described above, the surface acoustic wave filter device 1 has a structure in which the first longitudinally coupled resonator type surface acoustic wave filter portion 6 is cascade-connected to the second longitudinally coupled resonator type surface acoustic wave filter portion 7. The balanced-unbalanced conversion function and the impedance conversion function are provided by the second longitudinally coupled resonator type surface acoustic wave filter portion 7. The scheme of how these functions are provided will now be described in detail with reference to the operation of the surface acoustic wave filter device 1.

When an electrical signal is input from the unbalanced terminal 3, the electrical signal is delivered to the second IDT 12. Electrical signals having a phase difference of about 180 degrees are then output from the first and third IDTs 11 and 13. Subsequently, the output of the first longitudinally coupled resonator type surface acoustic wave filter portion 6 is input to the fourth and sixth IDTs 14 and 16 via the first and second interconnection lines 21 and 22, which connect the first and third IDTs 11 and 13 to the fourth and sixth IDTs 14 and 16 of the second longitudinally coupled resonator type surface acoustic wave filter portion 7. One of the balanced signals is provided from the second sub-divided IDT portions 15a2 of the first divided IDT portion 15a to the first balanced terminal 4. The other of the balanced signals is provided from the second sub-divided IDT portions 15b2 of the second divided IDT portion 15b to the second balanced terminal 5. The surface acoustic wave filter device 1 has the balanced-unbalanced conversion function.

In the first divided IDT portion 15a of the fifth IDT 15 connected to the first balanced terminal 4, the first sub-divided IDT portion 15a1 is electrically connected to the second sub-divided IDT portions 15a2 in series, while, in the second divided IDT portion 15b, the first sub-divided IDT portions 15b1 is electrically connected to the second sub-divided IDT portions 15b2 in series.

When one IDT is divided into two divided IDT portions in the crossing width direction and the two divided IDT portions are connected in series, the impedance becomes four times the impedance before the IDT is divided.

Accordingly, by dividing the fifth IDT 15 into the first and second divided IDT portions 15a and 15b in the surface wave propagating direction, the impedance is four times the impedance before the fifth IDT 15 is divided. Furthermore, by dividing the divided IDT portions in the crossing width direction, the impedance is four times the impedance before the divided IDT portion is further divided. Therefore, in this preferred embodiment, the ratio of the impedance of the unbalanced terminal 3 to the impedance of the balanced terminal 4 or 5 is about 1:16. As a result, the surface acoustic wave filter device 1 has a high-ratio impedance conversion function as compared to the known surface acoustic wave filter device 201 discussed in Patent Document 1.

Accordingly, even when the characteristic impedance of a differential amplifier connected to the subsequent stage of the surface acoustic wave filter device 1 is very high, the need for another impedance conversion component is eliminated or the level of the impedance conversion function of the required impedance conversion component is reduced, since the surface acoustic wave filter device 1 itself has a high-ratio impedance conversion function.

Furthermore, in the surface acoustic wave filter device 1, the outermost electrode fingers 14a and 16a of the fourth and sixth IDTs 14 and 16, which are adjacent to the fifth IDT 15, are connected to ground.

In a surface acoustic wave filter device having a balanced-unbalanced conversion function, if an electrode finger to which a balanced signal is applied is adjacent to an electrode finger to which an unbalanced signal is applied, the attenuation may be degraded at an out-of-band frequency or the balancing of the balanced signal may be degraded. This is because direct arrival waves are generated at a location at which the electrode finger to which a balanced signal is applied is adjacent to the electrode finger to which an unbalanced signal is applied.

However, in this preferred embodiment, the outermost electrode fingers 14a and 16a of the fourth and sixth IDTs 14 and 16, which are adjacent to the fifth IDT 15 from which a balanced signal is output, are connected to ground. Therefore, the electrode fingers 14a and 16a, each of which is one of the electrode fingers of the fourth and sixth IDTs 14 and 16 to which an unbalanced signal is applied and each of which is the closest to the fifth IDT 15, are not adjacent to the outermost electrode fingers of the fifth IDT 15. Consequently, the surface acoustic wave filter device 1 having a sufficient out-of-band attenuation and superior balancing is provided.

However, according to a preferred embodiment of the present invention, the outermost electrode fingers 14a and 16a, which are respectively the outermost electrode fingers of the IDTs 14 and 16 and are adjacent to the fifth IDT 15, are not necessarily connected to ground. Even in this case, a surface acoustic wave filter device having a high-ratio impedance conversion function and a balanced-unbalanced conversion function are provided.

Figure 2:
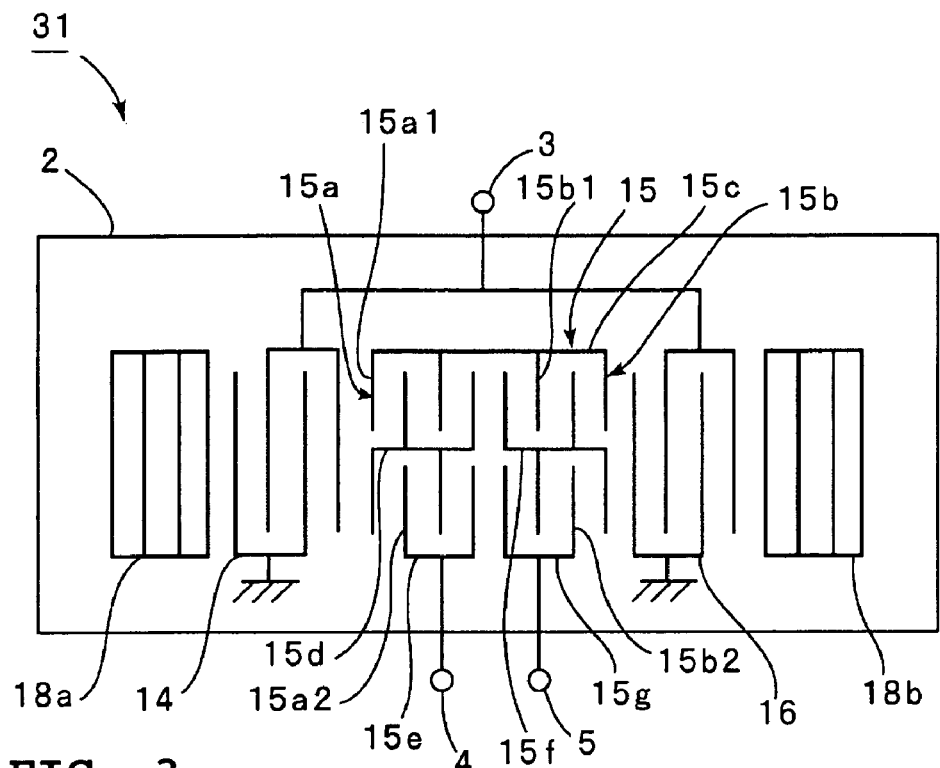
FIG. 2 is a schematic plan view of a modification of the surface acoustic wave filter device shown in FIG. 1.

As described above, in the surface acoustic wave filter device 1, the second longitudinally coupled resonator type surface acoustic wave filter portion 7 provides a balanced-unbalanced conversion function and an impedance conversion function. Accordingly, the first longitudinally coupled resonator type surface acoustic wave filter portion 6 of the surface acoustic wave filter device 1 is not necessarily required. FIG. 2 schematically illustrates a modification of the surface acoustic wave filter device 1 having a structure similar to the surface acoustic wave filter device 1 except that the first longitudinally coupled resonator type surface acoustic wave filter portion 6 is not provided.

As shown in FIG. 2, in a surface acoustic wave filter device 31 with this modification, the fourth and sixth IDTs 14 and 16 of the surface acoustic wave filter portion 7 shown in FIG. 1 are in common connection and are connected to the unbalanced terminal 3. Since the surface acoustic wave filter device 31 with this modification also has the fourth to sixth IDTs 14 to 16 as in the surface acoustic wave filter portion 7, the surface acoustic wave filter device 31 has a balanced-unbalanced conversion function and a high-ratio impedance conversion function.

However, since, in the surface acoustic wave filter device 1 shown in FIG. 1, the first longitudinally coupled resonator type surface acoustic wave filter portion 6 is disposed adjacent to the unbalanced terminal 3, the surface acoustic wave filter device 1 advantageously provides a greater amount of out-of-band attenuation than the surface acoustic wave filter device 31 of this modification.

Other portions of the structure of the surface acoustic wave filter device 31 are similar to those of the surface acoustic wave filter device 1, and therefore, the descriptions thereof are omitted.

Additionally, the surface acoustic wave filter device 1 shown in FIG. 1 and the surface acoustic wave filter device 31 shown in FIG. 2 have the structure in which each of first and second divided IDT portions arranged in the surface wave propagating direction further has first and second sub-divided IDT portions arranged in the crossing width direction. However, the surface acoustic wave filter device 1 and the surface acoustic wave filter device 31 may have first, second, and third sub-divided IDT portions arranged in the crossing width direction. Alternatively, the surface acoustic wave filter device 1 and the surface acoustic wave filter device 31 may have four or more sub-divided IDT portions arranged in the crossing width direction.

Figure 3:
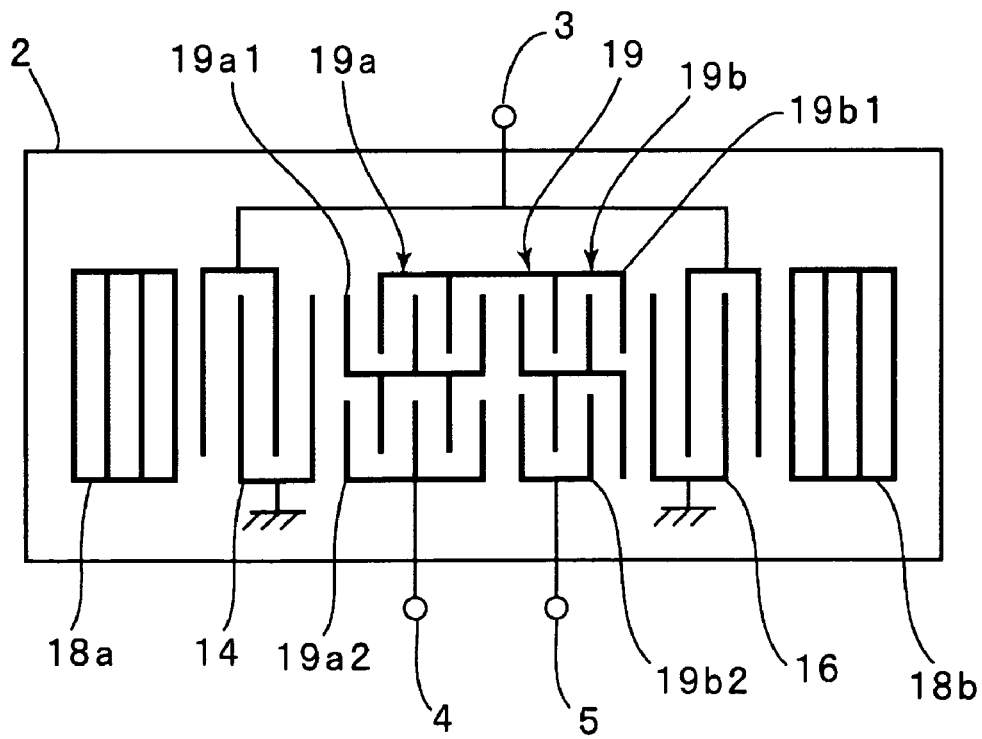
FIG. 3 is a schematic plan view of a modification of the surface acoustic wave filter device according to a preferred embodiment of the present invention.

Furthermore, in the acoustic wave filter device 31 shown in FIG. 2, the number of electrode fingers of the first sub-divided IDT portion 15a1 is equal to the number of electrode fingers of the first sub-divided IDT portion 15b1. Also, the number of electrode fingers of the second sub-divided IDT portion 15a2 is equal to the number of electrode fingers of the second sub-divided IDT portion 15b2. However, as shown by the modification in FIG. 3, the number of electrode fingers of the first sub-divided IDT portion 19a1 may be different from the number of electrode fingers of the first sub-divided IDT portion 19b1, and the number of electrode fingers of the second sub-divided IDT portion 19a2 may be different from the number of electrode fingers of the second sub-divided IDT portion 19b2. That is, the numbers of electrode fingers of the first and second divided IDT portions 19a and 19b arranged in the surface wave propagating direction may be different, and the first and second divided IDT portions 19a and 19b may be further divided into the first and second sub-divided IDT portions 19a1 and 19a2 and sub-divided IDT portions 19b1 and 19b2 in the surface wave propagating direction, respectively.

Second Preferred Embodiment

Figure 4:
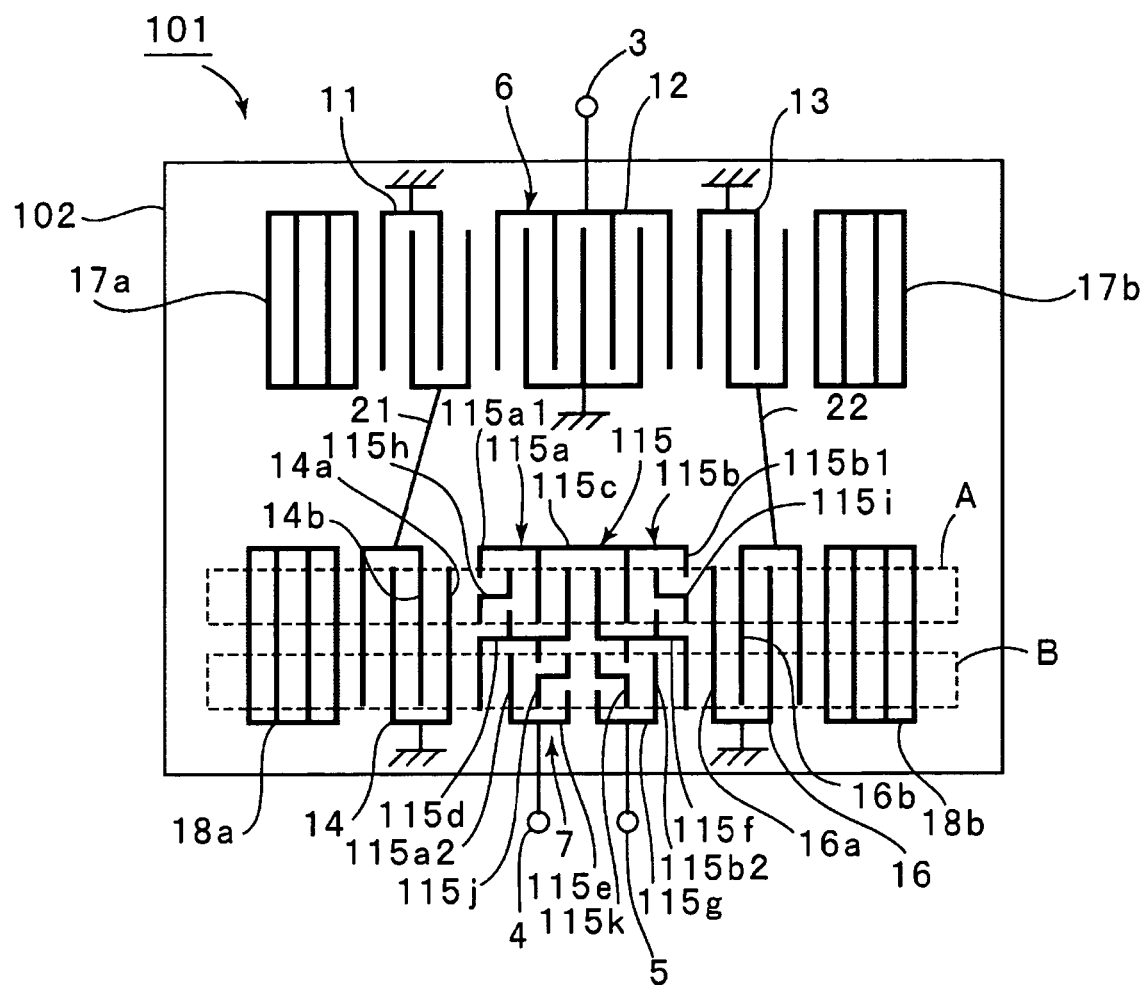
FIG. 4 is a schematic plan view of a surface acoustic wave filter device according to a second preferred embodiment of the present invention.

FIG. 4 schematically illustrates the electrode structure of a surface acoustic wave filter device according to a second preferred embodiment of the present invention. According to the second preferred embodiment, a surface acoustic wave filter device 101 has an electrode structure shown in FIG. 4 provided on a piezoelectric substrate 102. However, the surface acoustic wave filter device 101 according to the second preferred embodiment has a structure similar to that of the surface acoustic wave filter device 1 according to the first preferred embodiment except for including an IDT 115 shown in FIG. 4 instead of the IDT 15 of the surface acoustic wave filter device 1 shown in FIG. 1. Accordingly, the identical components are designated by identical reference numerals and the descriptions thereof are omitted.

In the surface acoustic wave filter device 101 according to the second preferred embodiment, the IDT 115 is arranged at the middle of the second longitudinally coupled resonator type surface acoustic wave filter portion 7 in the surface wave propagating direction includes first and second divided IDT portions 115a and 115b are arranged along the surface wave propagating direction. The first and second divided IDT portions 115a and 115b are electrically connected in series by a bus bar 115c. The bus bar 115c may be connected to ground or may be electrically floated.

In addition, the first and second divided IDT portions 115a and 115b include first and second sub-divided IDT portions 115a1 and 115a2 and first and second sub-divided IDT portions 115b1 and 115b2, respectively, which are divided portions arranged in a crossing width direction, namely, in a direction that is substantially perpendicular to the surface wave propagating direction.

That is, the first and second sub-divided IDT portions 115a1 and 115a2 are arranged in the first divided IDT portion 115a in the crossing width direction. The first and second sub-divided IDT portions 115a1 and 115a2 are connected in series by a connection bus bar 115d that is common to the two sub-divided IDT portions. In the first divided IDT portion 115a, the first sub-divided IDT portion 115a1 is provided between the above-described bus bar 115c and the connection bus bar 115d. Additionally, the second sub-divided IDT portions 115a2 is provided between the connection bus bar 115d and a divided bus bar 115e which faces the bus bar 115c across the connection bus bar 115d. The divided bus bar 115e is connected to the first balanced terminal 4.

Similarly, in the second divided IDT portion 115b, the first sub-divided IDT portion 115b1 is provided between the bus bar 115c and a connection bus bar 115f. Additionally, the second sub-divided IDT portion 115b2 is provided between the connection bus bar 115f and a divided bus bar 115g which faces the bus bar 115c across the connection bus bar 115f. The divided bus bar 115g is connected to the second balanced terminal 5.

Accordingly, as in the surface acoustic wave filter device 1 according to the first preferred embodiment, the surface acoustic wave filter device 101 according to the second preferred embodiment has a structure in which the first longitudinally coupled resonator type surface acoustic wave filter portion 6 is cascade-connected to the second longitudinally coupled resonator type surface acoustic wave filter portion 7. The balanced-unbalanced conversion function and the impedance conversion function are provided by the second longitudinally coupled resonator type surface acoustic wave filter portion 7. Additionally, since the fifth IDT 115 is configured as described above, the ratio of the impedance of the unbalanced terminal 3 to the impedance of the balanced terminal 4 or 5 is about 1:16.

Furthermore, in the surface acoustic wave filter device 101 according to the second preferred embodiment, by providing floating electrode fingers 115h and 115i as the outermost electrode fingers of the above-described first sub-divided IDT portions 115a1 and 115b1 in the surface wave propagating direction, series weighting is provided. In addition, by providing floating electrode fingers 115j and 115k as electrode fingers adjacent to the second sub-divided IDT portions 115a2 and 115b2, series weighting is provided.

According to this preferred embodiment, by performing the series weighting, a ripple that tends to occur in a passband is efficiently eliminated, and therefore, a superior filter characteristic is obtained. This design is now described with reference to FIG. 4, together with FIG. 5 that schematically illustrates the electrode structure of the surface acoustic wave filter device 1 according to the first preferred embodiment.

Figure 5:
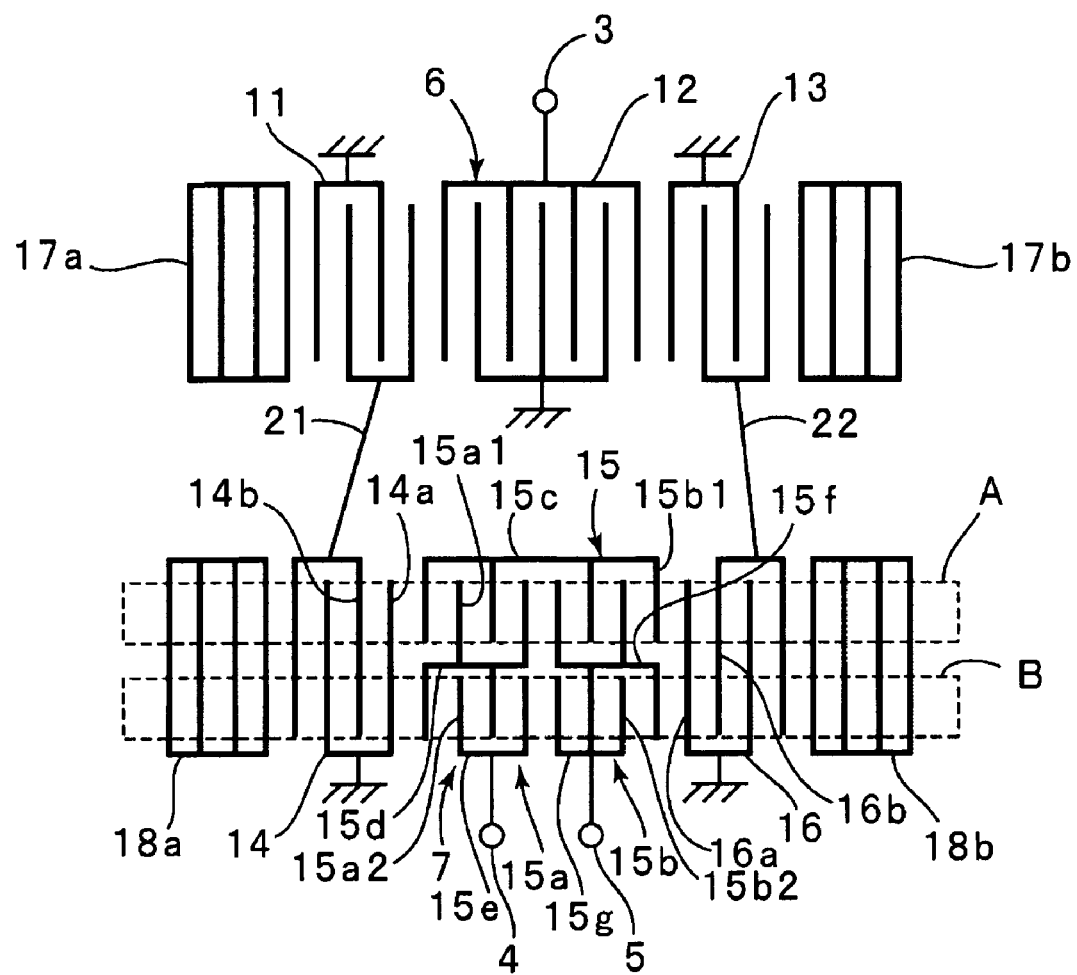
FIG. 5 is a schematic plan view of the electrode structure of a surface acoustic wave filter device according to a first preferred embodiment of the present invention.

FIG. 5 is a schematic plan view of the electrode structure of the surface acoustic wave filter device 1 according to the first preferred embodiment. As described above, in the surface acoustic wave filter device 1 according to the first preferred embodiment, the IDT 15 includes the first and second divided IDT portions 15a and 15b arranged in the surface wave propagating direction, and the first and second divided IDT portions 15a and 15b further include the first and second sub-divided portions 15a1 and 15a2 and the first and second sub-divided portions 15b1 and 15b2, respectively. Therefore, as shown by dashed lines A and B in FIG. 5, a first acoustic track A along which acoustic waves propagate in the first sub-divided IDT portions 15a1 and 15b1 and a second acoustic track B along which acoustic waves propagate in the second sub-divided IDT portions 15a2 and 15b2 are provided.

Figure 6:
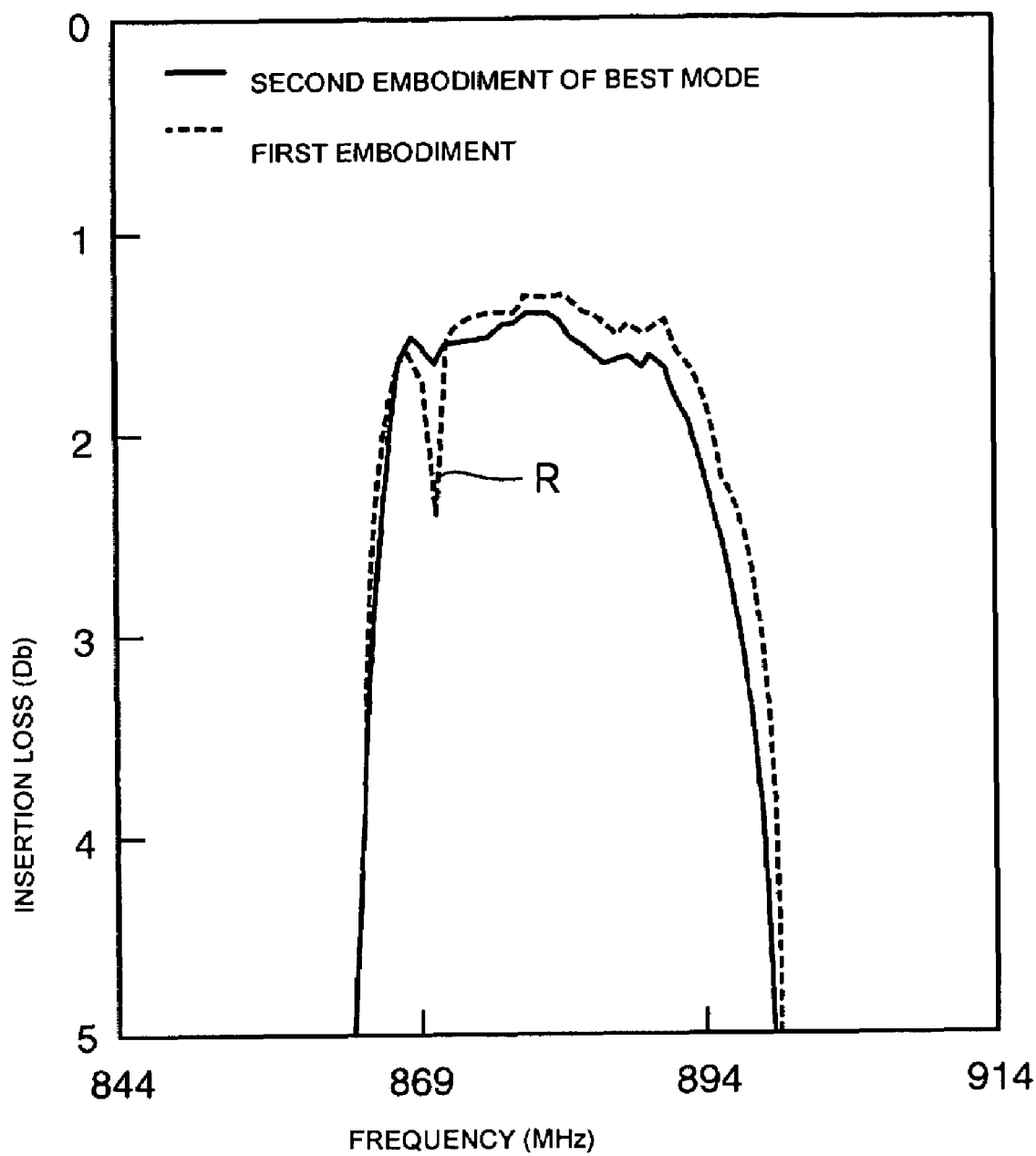
FIG. 6 is a diagram illustrating the attenuation-frequency characteristic of the surface acoustic wave filter device according to the first preferred embodiment and the second preferred embodiment of the present invention.

In contrast, as shown by a dashed line in FIG. 6, a ripple R may appear in a passband in the surface acoustic wave filter device 1 according to the first preferred embodiment. Accordingly, the inventors of the present invention have diligently studied how to reduce the ripple R and believed that the ripple R was caused by a difference between excitation strengths of surface acoustic waves on a first acoustic track formed in an area where the first sub-divided IDT portions 15a1 and 15b1 are provided and on a second acoustic track formed in an area where the second sub-divided IDT portions 15a2 and 15b2 are provided.

That is, in the electrode structure shown in FIG. 5, the excitation strength of surface acoustic waves in a gap between the second sub-divided IDT portions 15a2 and 15b2 along the second acoustic track B is greater than that in a gap between the first sub-divided IDT portions 15a1 and 15b1. Similarly, the excitation strengths of surface acoustic waves in a gap between the outer edge of the second sub-divided IDT portions 15a2 and the adjacent IDT 14 and in a gap between the outer edge of the second sub-divided IDT portions 15b2 and the adjacent IDT 16 in the surface wave propagating direction are greater than those in a gap between the outer edge of the first sub-divided IDT portions 15a1 and the adjacent IDT 14 and in a gap between the outer edge of the first sub-divided IDT portions 15b1 and the adjacent IDT 16 in the surface wave propagating direction, respectively.

In contrast, the surface acoustic wave filter device 101 according to the second preferred embodiment has the first and second acoustic tracks A and B. On the first acoustic track A, series weighting is performed such that the floating electrode fingers 115h and 115i are provided at the outer edges of the first and second sub-divided IDT portions 115a1 and 115a2 in the surface wave direction. Thus, the excitation strengths of surface acoustic waves in a gap between the first sub-divided IDT portion 115a1 and the adjacent IDT 14 and in a gap between the first sub-divided IDT portions 115b1 and the adjacent IDT 16 are increased.

In the second acoustic track B, by providing the floating electrode fingers 115j and 115k as the electrode fingers facing the gap between the second sub-divided IDT portions 115a2 and 115b2, series weighting is performed. Thus, the excitation strength of surface acoustic waves in a gap between the second sub-divided IDT portions 115a2 and 115b2 is decreased.

Accordingly, in the surface acoustic wave filter device 101 according to the second preferred embodiment, the excitation strength of surface acoustic waves along the first acoustic track A is substantially the same as the excitation strength along the second acoustic track B. As a result, as shown in a solid line in FIG. 6, a ripple in a passband is efficiently eliminated.

Additionally, as described above, in the surface acoustic wave filter device 101 according to the second preferred embodiment, on the first acoustic track A, series weighting is applied to a gap on either side of the IDT 115 in the surface wave propagating direction to change the excitation strength of surface acoustic waves so as to be increased. In contrast, on the second acoustic track B, series weighting is applied to a gap between the second sub-divided IDT portions 115a2 and 115b2 to change the excitation strength of surface acoustic waves so as to be decreased. However, according to preferred embodiments of the present invention, the means for adjusting the excitation strength of surface acoustic waves along the first acoustic track A to be substantially the same as the excitation strength along the second acoustic track B can be modified in various ways. FIGS. 7A through 9B illustrate examples of these modifications.

Figure 7A:
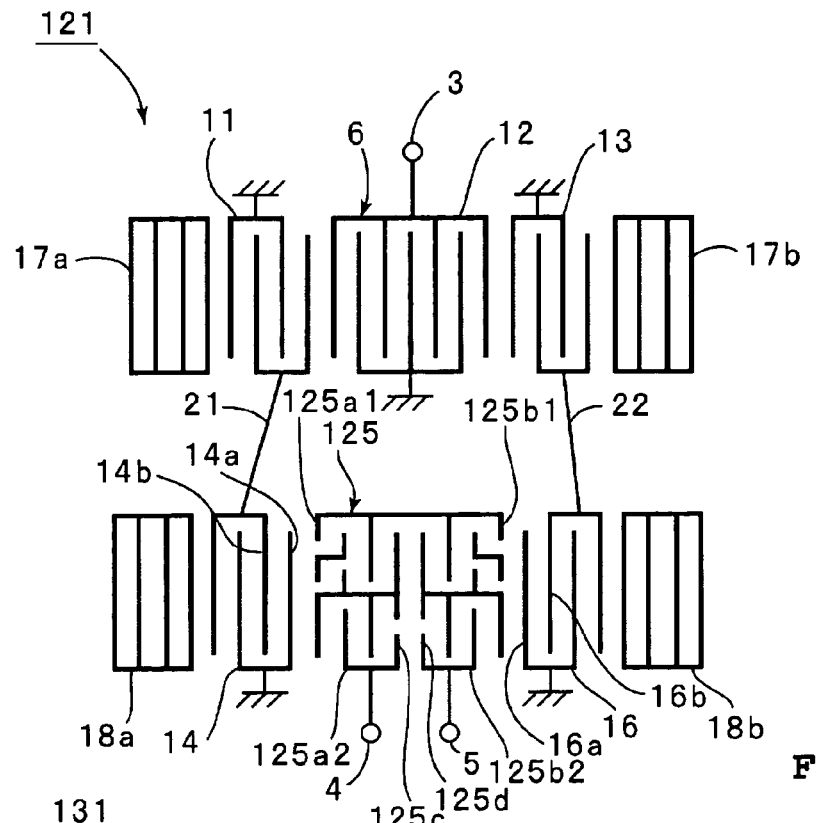
FIGS. 7A and 7B are schematic plan views of the electrode structures of the modifications of the surface acoustic wave filter device according to the second embodiment of the present invention.

In a surface acoustic wave filter device 121 of the modification shown in FIG. 7A, an IDT 125 having a divided IDT portion connected to first and second balanced terminals includes first and second divided IDT portions 125a and 125b. The divided IDT portion 125a includes sub-divided IDT portions 125a1 and 125a2 while the divided IDT portion 125b includes sub-divided IDT portions 125b1 and 125b2. The first sub-divided IDT portions 125a1 and 125b1 are similar to the first sub-divided IDT portions 115a1 and 115b1 according to the second preferred embodiment.

The difference is that, in the second sub-divided IDT portions 125a2 and 125b2, crossing-width weighting is applied to a portion facing a gap between the sub-divided IDT portions 125a2 and 125b2 instead of applying series weighting such that the length of at least one electrode finger is reduced. That is, crossing-width weighting is applied such that the lengths of electrode fingers 125c and 125d facing the gap are decreased to a length less than that of other electrodes connected to the same potential level in order to decrease the excitation strength of surface acoustic waves.

Figure 7B:
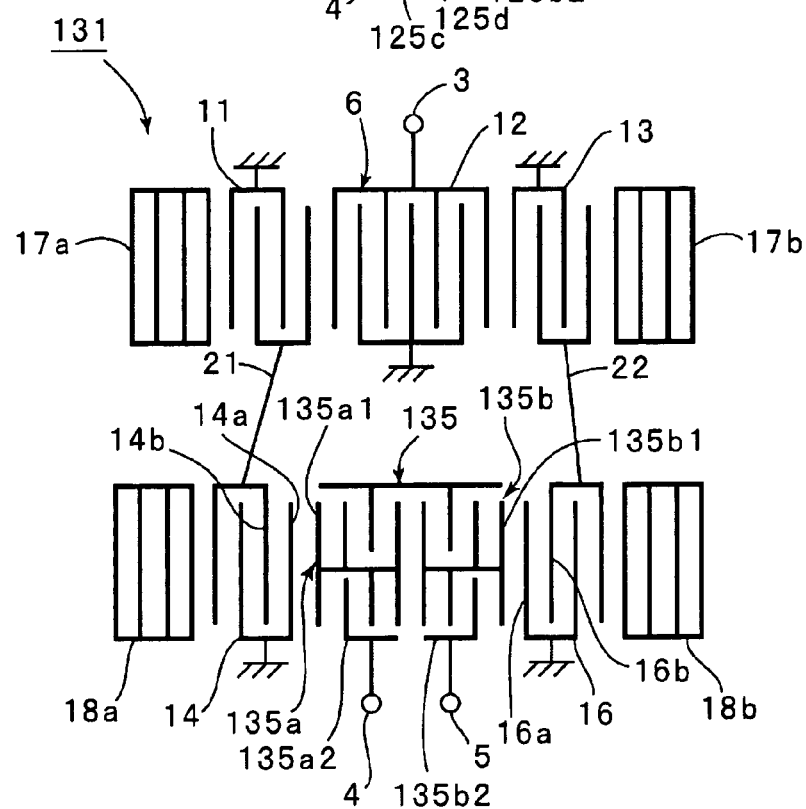

In contrast, in a fifth IDT 145 of a surface acoustic wave filter device 131 of the modification shown in FIG. 7B, a fifth IDT 135 includes first and second divided IDT portions 135a and 135b obtained by dividing the fifth IDT 135 into two in the surface wave propagating direction. The first and second divided IDT portions 135a and 135b include first and second sub-divided IDT portions 135a1 and 135a2 and first and second sub-divided IDT portions 135b1 and 135b2 obtained by dividing the first and second divided IDT portions 135a and 135b in a direction that is substantially perpendicular to the surface wave propagating direction, respectively. Here, thinning-out weighting is applied to the first sub-divided IDT portions 135a1 and 135b1 so as to increase the excitation strength of surface acoustic waves in a gap on either side of the fifth IDT 135 on the first acoustic track in the surface wave propagating direction. Similarly, thinning-out weighting is applied to decrease the excitation strength of surface acoustic waves in a gap between the second sub-divided IDT portions 135a2 and 135b2.

Figure 8A:
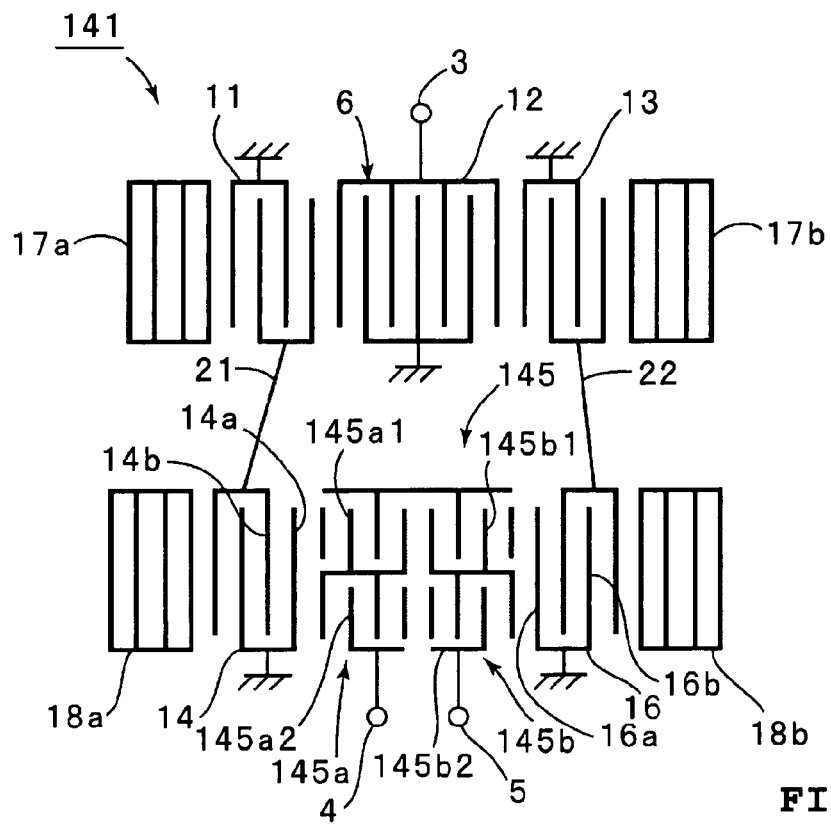
FIGS. 8A and 8B are schematic plan views of the electrode structures of the modifications of the surface acoustic wave filter device according to the second preferred embodiment of the present invention.

In a fifth IDT 145 of a surface acoustic wave filter device 141 of the modification shown in FIG. 8A, thinning-out weighting is applied by providing outer electrode fingers of first sub-divided IDT portions 145a1 and 145b1 in the surface wave propagating direction as floating electrode fingers. This design increases the excitation strength of surface acoustic waves in a gap on either side of the first sub-divided IDT portions 145a1 and 145b1 in the surface wave propagating direction on the first acoustic track. In contrast, in a gap between second sub-divided IDT portions 145a2 and 145b2, thinning-out weighting is applied such that electrode fingers facing the gap are provided as floating electrode fingers. Thus, the excitation strength of surface acoustic waves on the second acoustic track is decreased.

Figure 8B:
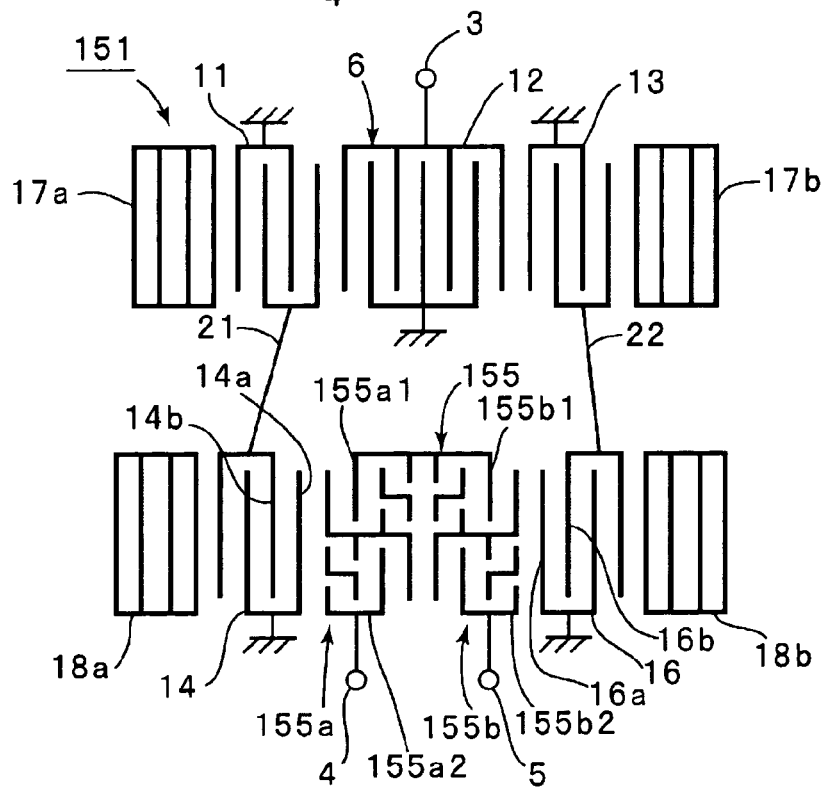

In a surface acoustic wave filter device 151 shown in FIG. 8B, series weighting is applied such that electrode fingers facing a gap between first sub-divided IDT portions 155a1 and 155b1 include a floating electrode. Thus, the excitation strength of surface acoustic waves in the gap on the first acoustic track is decreased.

However, in this modification, series weighting is applied such that a floating electrode finger is provided as the outermost electrode fingers of second sub-divided IDT portions 155a2 and 155b2 in the surface wave propagating direction. Therefore, the excitation strength in a gap between the second sub-divided IDT portions 155a2 and 155b2 is decreased. In addition, a difference of potential between electrode fingers facing a gap between the second sub-divided IDT portions 155a2 and 155b2 is decreased, and therefore, the excitation strength of surface acoustic waves in the gap is also decreased. Accordingly, the excitation strength of surface acoustic waves on the second acoustic track is further decreased as compared to that on the first track. As a result, the excitation strength of surface acoustic waves on the first acoustic track is substantially the same as the excitation strength on the second acoustic track.

Thus, according to various preferred embodiments of the present invention, in the means for adjusting the excitation strength of surface acoustic waves on the first acoustic track to be substantially the same as the excitation strength on the second acoustic track, the excitation strengths on both first and second acoustic tracks may be decreased while changing the decreasing rate on the first acoustic track from that on the second acoustic tracks. Conversely, the excitation strengths on both first and second acoustic tracks may be increased while changing the increasing rate on the first acoustic track from that on the second acoustic track so as to adjust the excitation strength of surface acoustic waves on the first acoustic track to be substantially the same as that on the second acoustic track.

Figure 9A:
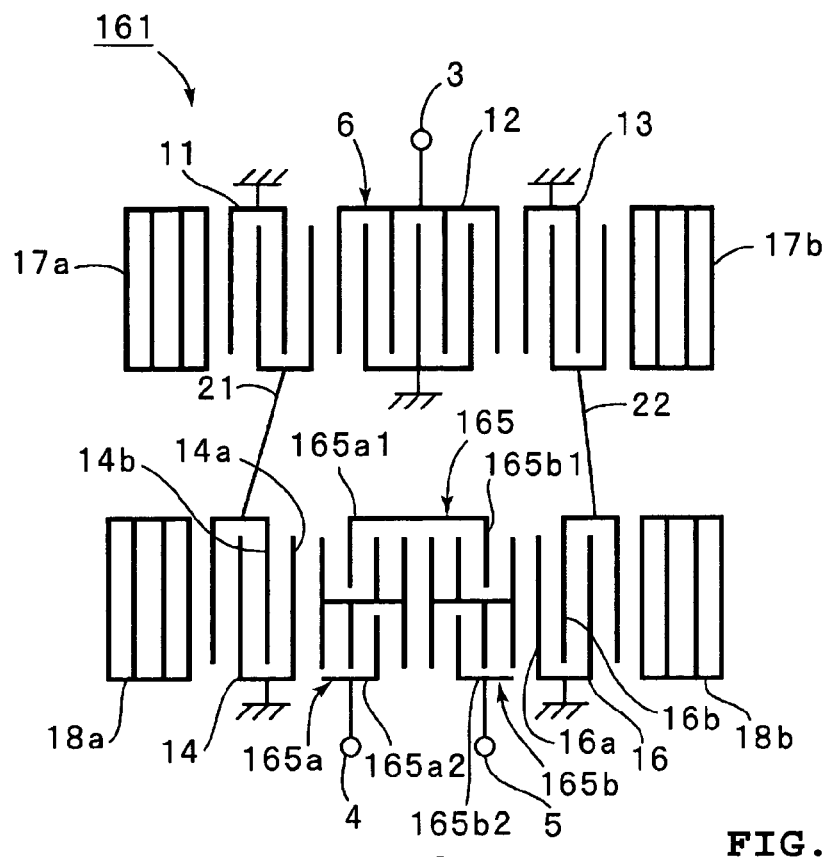
FIGS. 9A and 9B are schematic plan views of the electrode structures of the modifications of the surface acoustic wave filter device according to the second preferred embodiment of the present invention.

In a surface acoustic wave filter device 161 of the modification shown in FIG. 9A, thinning-out weighting is applied to the fifth IDT 165 such that the excitation strength of surface acoustic waves on the first acoustic track is substantially the same as the excitation strength on the second acoustic track. That is, thinning-out weighting is applied in gaps adjacent to first sub-divided IDT portions 165a1 and 165b1 such that the excitation strength is decreased. In contrast, thinning-out weighting is applied to second sub-divided IDT portions 165a2 and 165b2 such that the excitation strength of surface acoustic waves in gaps between the outermost edge of the second sub-divided IDT portion 165a2 in the surface wave propagating direction and the IDT 14 and between the outermost edge of the second sub-divided IDT portion 165b2 in the surface wave propagating direction and the IDT 16 is decreased. This decreasing rate of the excitation strength is determined to be greater than the decreasing rate of the excitation strength on the first acoustic track. As a result, the excitation strength of surface acoustic waves on the first acoustic track is adjusted to be substantially the same as that on the second acoustic track.

Figure 9B:
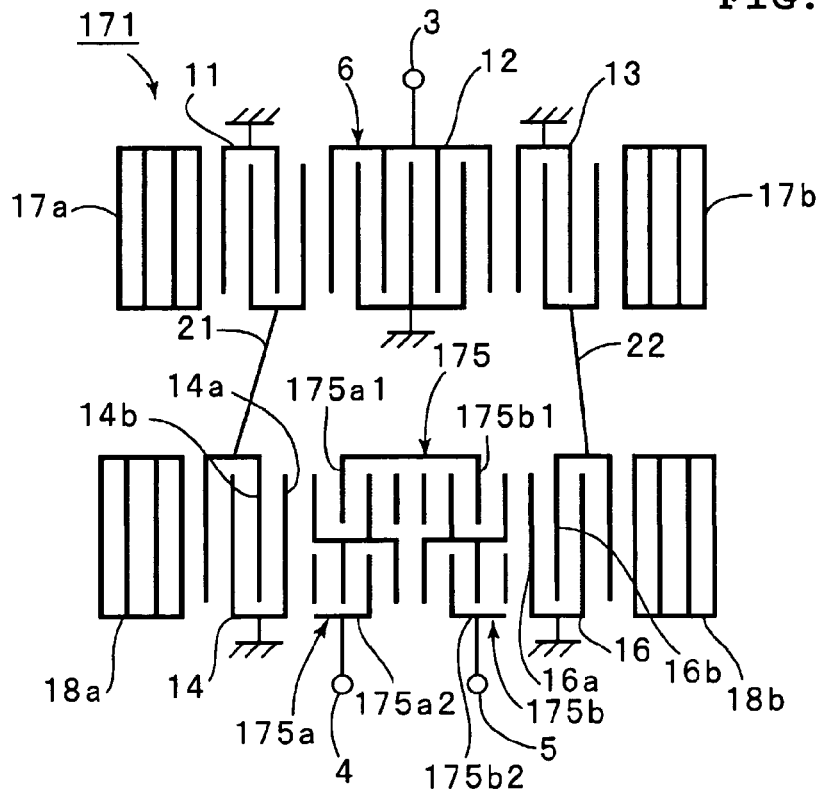

In a surface acoustic wave filter device 171 of the modification shown in FIG. 9B, thinning-out weighting is also applied to the fifth IDT 175 such that the excitation strength of surface acoustic waves on the first acoustic track is substantially the same as that on the second acoustic track. More specifically, thinning-out weighting is applied to first sub-divided IDT portions 175a1 and 175b1 by providing a floating electrode finger at the portions of the first sub-divided IDT portions 175a1 and 175b1 facing a gap between the first sub-divided IDT portions 175a1 and 175b1 such that the excitation strength on the first acoustic track A is increased. In addition, thinning-out weighting is applied on the second acoustic track B. More specifically, the outermost electrode fingers of the second sub-divided IDT portions 175a2 and 175b2 in the surface wave propagating direction are made to be floating electrode fingers so as to decrease the excitation strength in a gap between the IDTs 14 and 16. Thus, the excitation strength of surface acoustic waves on the second acoustic track is decreased, and therefore, the excitation strength of surface acoustic waves on the first acoustic track A is to be substantially the same as that on the second acoustic track B.

As shown in FIGS. 7A through 9B, according to the present invention, means for changing the excitation strength of surface acoustic waves to adjust the excitation strength on the first acoustic track A to be substantially the same as that on the second acoustic track B is easily achieved by various types of weighting, such as thinning-out weighting, crossing width weighting, and series weighting. Adjustment of the excitation strength by weighting, only requires changing the shape of an electrode. Thus, the excitation strength is easily and reliably adjusted, and therefore, a ripple in a passband is efficiently eliminated.

Even when weighting is applied to either one of the first acoustic track A and second acoustic track B, the excitation strength on the first acoustic track A can substantially the same as that on the second acoustic track B.

Figure 10:
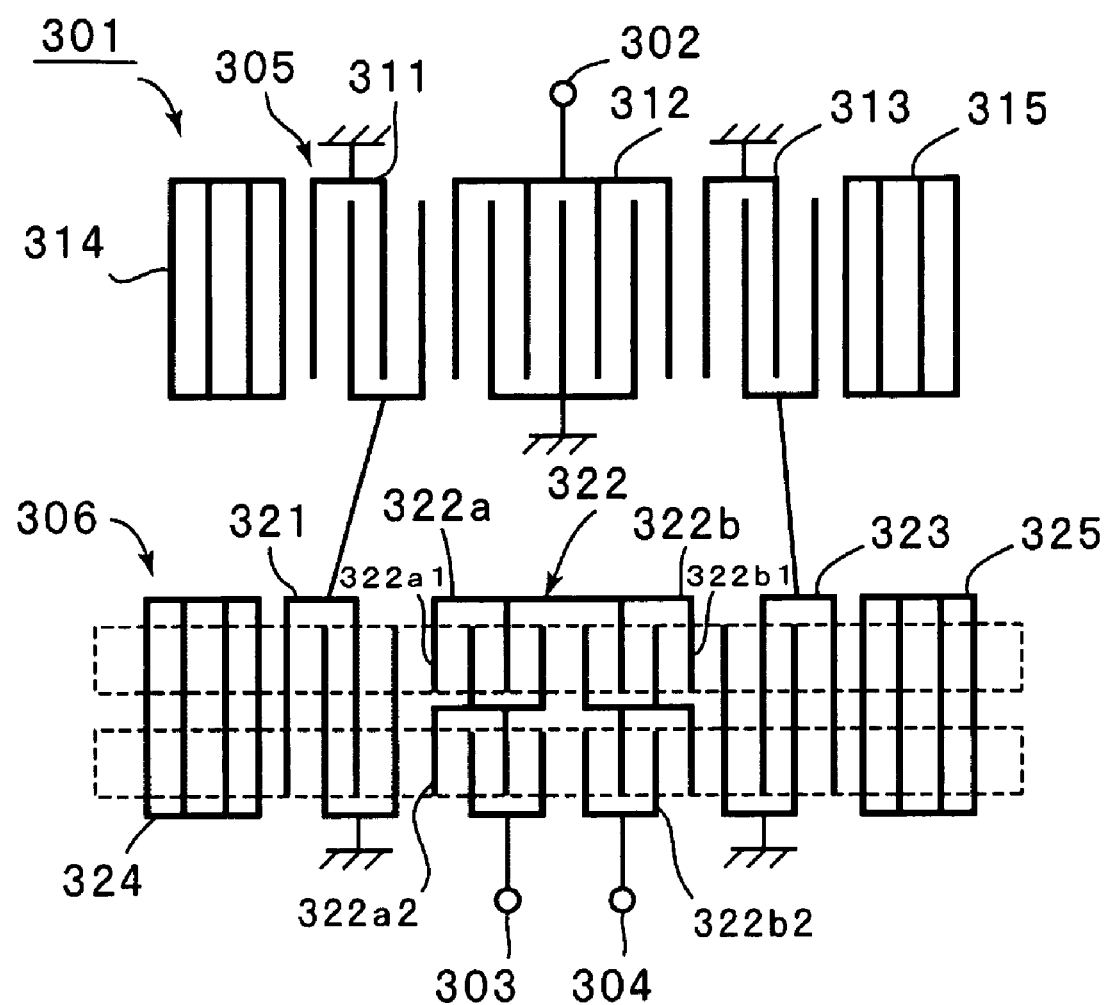
FIG. 10 is a schematic plan view of the electrode structure of a balanced acoustic wave filter device according to a third preferred embodiment of the present invention.

FIG. 10 is a schematic plan view illustrating the electrode structure of a balanced surface acoustic wave filter device according to a third preferred embodiment of the present invention. This electrode structure is provided on a piezoelectric substrate including a LiTaO$_3$ single-crystal substrate. According to the third preferred embodiment of the present invention, the LiTaO$_3$ single-crystal substrate provides a surface wave propagating direction in the crystal X-axis direction and a cut-angle of the substrate at a Y-axis rotation angle±45 degrees. However, the piezoelectric substrate may be formed from another suitable piezoelectric substrate single-crystal material.

The electrode structure shown in FIG. 10 is formed from a layered metallic film in which a Ti film having a thickness of about 10 nm and an Al film having a thickness of about 328 nm are layered on the above-described LiTaO$_3$ substrate.

As shown in FIG. 10, a first longitudinally coupled resonator type surface acoustic wave filter 305 is connected to an unbalanced terminal 302. The surface acoustic wave filter 305 includes first to third IDTs 311 to 313 arranged in the surface wave propagating direction and reflectors 314 and 315. One end of the IDT 312 is connected to an unbalanced terminal 302.

In addition, a second longitudinally coupled resonator type surface acoustic wave filter 306 is connected to the subsequent stage of the surface acoustic wave filter 305. The surface acoustic wave filter 306 includes first to third IDTs 321 to 323. One end of the first IDT 312 and one end of the third IDT 313 are electrically connected to one end of the first IDT 311 and one end of the third IDT 313 of the surface acoustic wave filter 305, respectively.

Additionally, the second IDT 322 includes first and second divided IDT portions 322a and 322b obtained by dividing the second IDT 322 into two in the surface acoustic wave propagating direction. The first and second divided IDT portions 322a and 322b include first and second sub-divided IDT portions 322a1 and 322a2 and first and second sub-divided IDT portions 322b1 and 322b2 arranged in a direction that is substantially perpendicular to the surface wave propagating direction, respectively.

A first balanced terminal 303 is connected to the second sub-divided IDT portion 322a2 of the first divided IDT portion 322a. While, a second balanced terminal 304 is connected to the second sub-divided IDT portion 322b2 of the second divided IDT portion 322b. Additionally, reflectors 324 and 325 are arranged on either side of an area where the IDTs 321 to 323 are arranged in the surface wave propagating direction.

Each of the IDTs 311 to 313 and 321 to 323 has a narrow-pitch electrode finger portion in which adjacent electrode fingers has a relatively small electrode finger pitch in the surface acoustic wave propagating direction.

According to this preferred embodiment, in a surface acoustic wave filter device 301, the surface acoustic wave filters 305 and 306 have the above-described electrode structure. The phase of the IDT 311 is inverted from that of the IDT 313 such that electrical signals flowing from the unbalanced terminal 302 to the first balanced terminal 303 and flowing from the unbalanced terminal 302 to the second balanced terminal 304 have a 180-degree phase difference. It is noted that the phases of the IDTs 321 and 323 are set to substantially the same value.

Consequently, a balanced-unbalanced conversion function is provided.

In contrast, according to this preferred embodiment, the above-described IDT 322 includes the first and second divided IDT portions 322a and 322b. The first divided IDT portion 322a is connected to the second divided IDT portion 322b in series. The first and second divided IDT portions 322a and 322b further include sub-divided IDT portions 322a1 and 322a2 and sub-divided IDT portions 322b1 and 322b2, respectively. Consequently, the ratio of the impedance on the side of the unbalanced terminal 302 to the impedance on the side of the balanced terminals 303 and 304 is increased to about 1:16.

In addition, according to this preferred embodiment, the metallization ratio in the narrow-pitch electrode finger portion of the IDT 322 on the first acoustic track passing through the first sub-divided IDT portions 322a1 and 322b1 is less than that in the narrow-pitch electrode finger portion on the second acoustic track passing through the second sub-divided IDT portions 322a and 322b. Furthermore, the metallization ratio in a main portion of the first acoustic track passing through the first sub-divided portion is less than that on the second acoustic track. Accordingly, the ratio of the excitation strength on the first acoustic track to the excitation strength of surface acoustic waves on the second acoustic track is reduced. Therefore, the resonant frequency of the first acoustic track is substantially the same as that of the second acoustic track, thereby efficiently reducing a ripple that tends to occur in the passband.

As used herein, the term "metallization ratio" refers to a ratio of the width of an electrode finger along the surface acoustic wave propagating direction to the sum of the width of the electrode finger and a space between the electrode finger and the adjacent electrode finger in the same direction.

This preferred embodiment is described with reference to a particular example of an experiment.

In an example of the surface acoustic wave filter device 301 according to the above-described preferred embodiment, the number of pairs of electrode fingers of the IDT 311 or 313 was set to 11.5. The number of pairs of electrode fingers of the IDT 312 was set to 18.5. Among a plurality of electrode fingers of the IDT 311, five electrode fingers adjacent to the IDT 312 define a narrow-pitch electrode finger portion. Similarly, among a plurality of electrode fingers of the IDT 313, electrode fingers adjacent to a third IDT 312 define a narrow-pitch electrode finger portion. The pitch of electrode fingers in the narrow-pitch electrode finger portion was about 2.0 μm. The pitch of electrode fingers in an area other than the narrow-pitch electrode finger portion, that is, the pitch of electrode fingers in the main portion was about 2.113 μm.

Additionally, the number of the reflectors 314 or 315 was set to 80. The pitch of electrode fingers in the reflectors was set to about 2.3 μm.

In contrast, the number of pairs of electrode fingers of the first IDT 321 or the third IDT 323 of the second longitudinally coupled resonator type surface acoustic wave filter 306 was set to 11.5. The pitch of electrode fingers in the main portion was set to about 2.115 μm. In each of the IDTs 321 and 323, four electrode fingers adjacent to the IDT 322 defined a narrow-pitch electrode finger portion. The pitch of electrode fingers in the narrow-pitch electrode finger portion was about 1.988 μm.

Furthermore, in each of the IDTs 321 and 323, the metallization ratio in the narrow-pitch electrode finger portion was set to about 0.63. The metallization ratio in the main portion was set to about 0.65.

The number of pairs of electrode fingers of the IDT 322 was set to 9.5. The pitch of electrode fingers in the main portion was about 2.12 μm. In the IDT 322, six electrode fingers adjacent to the IDT 321 and six electrode fingers adjacent to the IDT 323 defined narrow-pitch electrode finger portions. The pitch of electrode fingers in these narrow-pitch electrode finger portions was about 1.968 μm.

In the IDT 322, the metallization ratios in the main portion and in the narrow-pitch electrode finger portion on the first acoustic track were set to about 0.63 and about 0.47, respectively. The metallization ratios in the main portion and in the narrow-pitch electrode finger portion on the second acoustic track were set to about 0.65 and about 0.65, respectively.

Additionally, the number of the reflectors 324 or 325 was set to 80. The pitch of electrode fingers in the reflectors was set to about 2.136 μm, and the metallization ratio was set to about 0.66.

Figure 11:
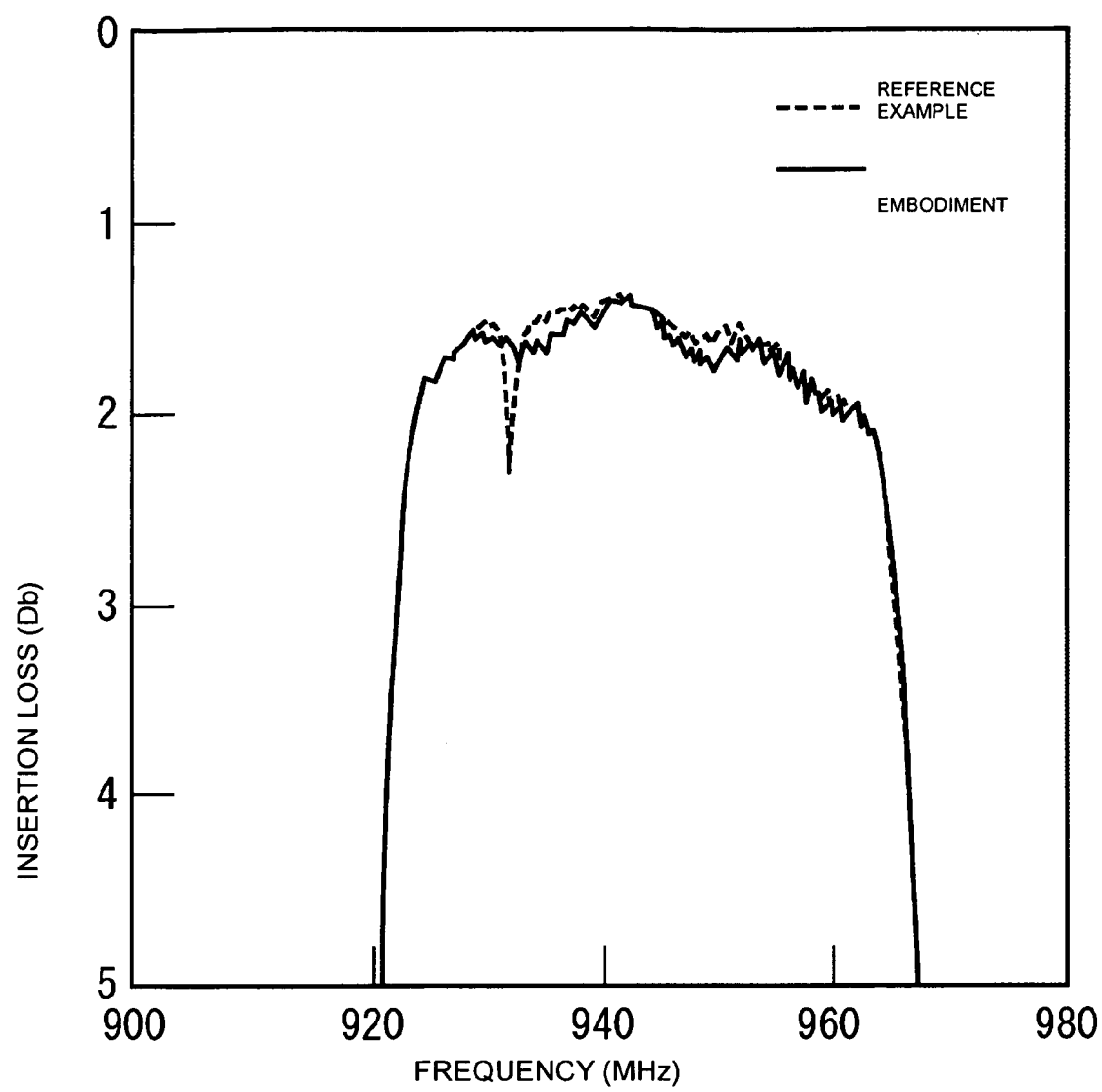
FIG. 11 is a diagram illustrating the filter characteristic of the surface acoustic wave filter device according to the third preferred embodiment and the filter characteristic of a reference example of a surface acoustic wave filter device prepared for the purpose of comparison.

FIG. 11 illustrates the filter characteristics of the surface acoustic wave filter according to this preferred embodiment. For the purpose of comparison, the filter characteristic of a surface acoustic wave filter device having the same structure of this preferred embodiment except that the metallization ratio on the first acoustic track is equal to that on the second acoustic track is shown by a dashed line. As seen from the comparison between the solid line and the dashed line in FIG. 11, by changing the metallization ratio on the first acoustic track from that on the second acoustic track as in the above-described preferred embodiment so as to adjust the excitation strength on the first acoustic track to be substantially the same as that on the second acoustic track, a ripple that occurs in the passband is efficiently reduced.

Figure 12:
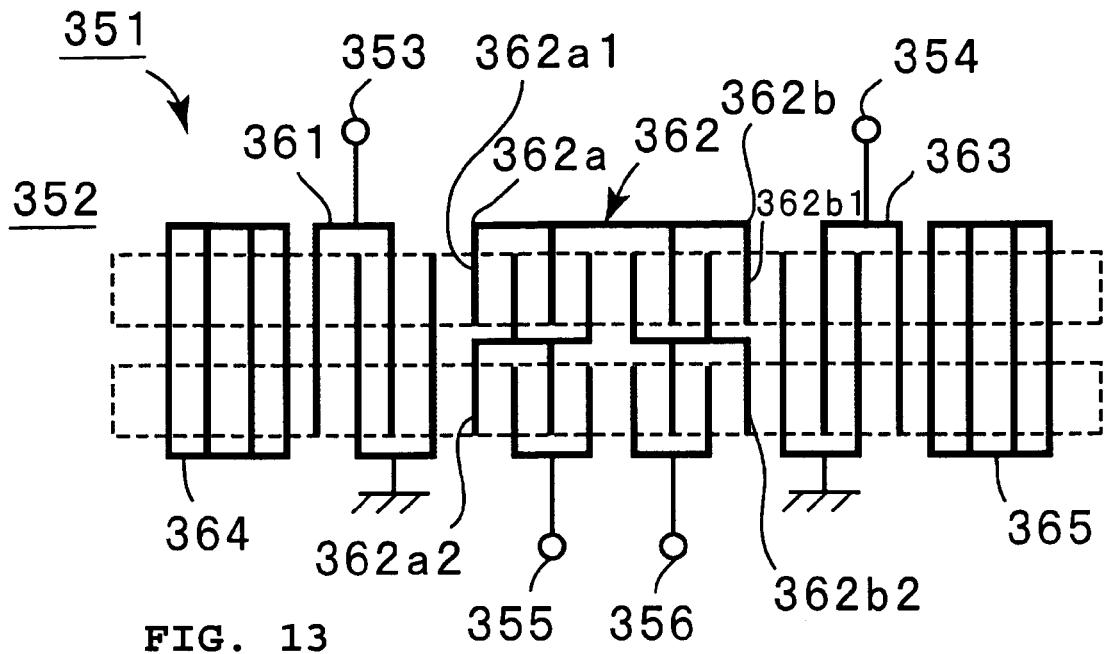
FIG. 12 is a schematic plan view of the electrode structure of an acoustic wave filter device according to a fourth preferred embodiment of the present invention.

FIG. 12 is a schematic plan view of the electrode structure of a surface acoustic wave filter device according to a fourth preferred embodiment of the present invention.

In a surface acoustic wave filter device 351 according to this preferred embodiment, the electrode structure shown in FIG. 12 is provided on a piezoelectric substrate 352. Here, first to third IDTs 361 to 363 are arranged in the surface acoustic wave propagating direction. Reflectors 364 and 365 are arranged on either side of an area in which the IDTs 361 to 363 are arranged. One end of the IDT 361 and one end of the IDT 363 are connected to a first balanced terminal 353 and a second balanced terminal 354, respectively. The other ends of the IDTs 361 and 363 are connected to ground.

The IDT 362 includes first and second divided IDT portions 362a and 362b obtained by dividing the IDT 362 into two in the surface wave propagating direction. The first and second divided IDT portions 362a and 362b include first and second sub-divided IDT portions 362a1 and 362a2 and first and second sub-divided IDT portions 362b1 and 362b2 arranged in a direction is substantially perpendicular to the surface wave propagating direction, respectively. Third and fourth balanced terminals 355 and 356 are electrically connected to the second sub-divided IDT portions 362a2 and 362b2, respectively.

When balanced signals are applied to the first and second balanced terminals 353 and 354, balanced signals are generated at the third and fourth terminals 355 and 356. Conversely, when balanced signals are applied to the third and fourth terminals 355 and 356, balanced signals are generated at the first and second balanced terminals 353 and 354. That is, the acoustic wave filter device 351 is obtained that serves as a bandpass filter having a balanced-balanced signal conversion function.

Here, in the IDT 362 of the sub-divided IDT portion, in order to adjust the excitation strength on a first acoustic track that propagates surface acoustic waves in an area in which the first sub-divided IDT portions 362a1 and 362b1 to be substantially the same as the excitation strength on a second acoustic track that propagates surface acoustic waves in an area in which the second sub-divided IDT portions 362a2 and 362b2 are arranged, a narrow-pitch electrode finger portion is provided in the sub-divided IDTs 362a1 and 362b1 located on the first acoustic track. In addition, the metallization ratio in this narrow-pitch electrode finger portion is less than that in a narrow-pitch electrode finger portion corresponding to the sub-divided IDT portions 362a2 and 362b2 located on the second acoustic track. Furthermore, in the IDT 362, the metallization ratio in a main portion of the first acoustic track not connected to the balanced terminal is less than that in a main portion of the second acoustic track connected to the balanced terminals 353 and 354. Thus, as in the above-described surface acoustic wave filter device 301, a ripple that tends to occurs in the passband is efficiently eliminated.

Figure 13:
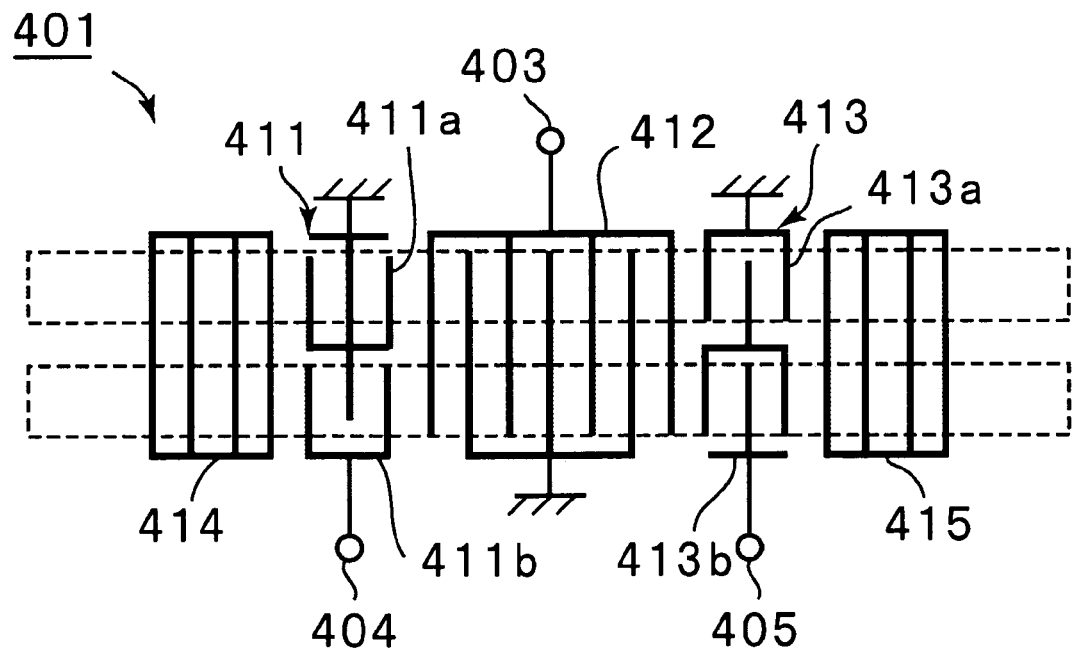
FIG. 13 is a schematic plan view of the electrode structure of an acoustic wave filter device according to a fifth preferred embodiment of the present invention.

FIG. 13 is a schematic plan view of the electrode structure of a surface acoustic wave filter device according to a fifth preferred embodiment of the present invention.

In a surface acoustic wave filter device 401, first to third IDTs 411 to 413 are arranged in the surface acoustic wave propagating direction. Reflectors 414 and 415 are arranged on either side of an area in which the first to third IDTs 411 to 413 are arranged.

An unbalanced terminal 403 is connected to one end of the second IDT 412. The other end of the IDT 412 is connected to ground.

One end of the IDT 411 and one end of the IDT 413 are connected to ground. The other end of the IDT 411 is electrically connected to a first balanced terminal 404, and the other end of the IDT 413 is electrically connected to a second balanced terminal 405.

The IDTs 411 and 413 are arranged such that electrical signals flowing from the unbalanced terminal 403 to the first balanced terminal 404 and flowing from the unbalanced terminal 403 to the second balanced terminal 405 have a 180-degree phase difference.

In contrast, according to this preferred embodiment, the first and third IDTs 411 and 413 include first sub-divided IDT portions 411a and 411b and second sub-divided IDT portions 413a and 413b obtained by dividing first and third IDTs 411 and 413 into two in a direction that is substantially perpendicular to the surface wave propagating direction, respectively.

As described above, a first acoustic track passing through the first sub-divided IDT portions 411a and 413a and a second acoustic track passing through the second sub-divided IDT portions 411b and 413b are provided. In this preferred embodiment, in order to adjust the excitation strength on the first acoustic track to be substantially the same as that on the second acoustic track, the metallization ratio on the first acoustic track is less than that on the second acoustic track. More specifically, in an area of each of the IDTs 411 to 413 which is adjacent to other IDTs, a narrow-pitch electrode finger portion is provided such that the metallization ratio in the narrow-pitch electrode finger portion on the first acoustic track is less than that in the corresponding narrow-pitch electrode finger portion on the second acoustic track. Also, the metallization ratio in a main portion of the first acoustic track is less than that in a main portion of the second acoustic track. Thus, as in the above-described surface acoustic wave filter device 301, a ripple that tends to occur in the passband is efficiently eliminated.

Figure 14:
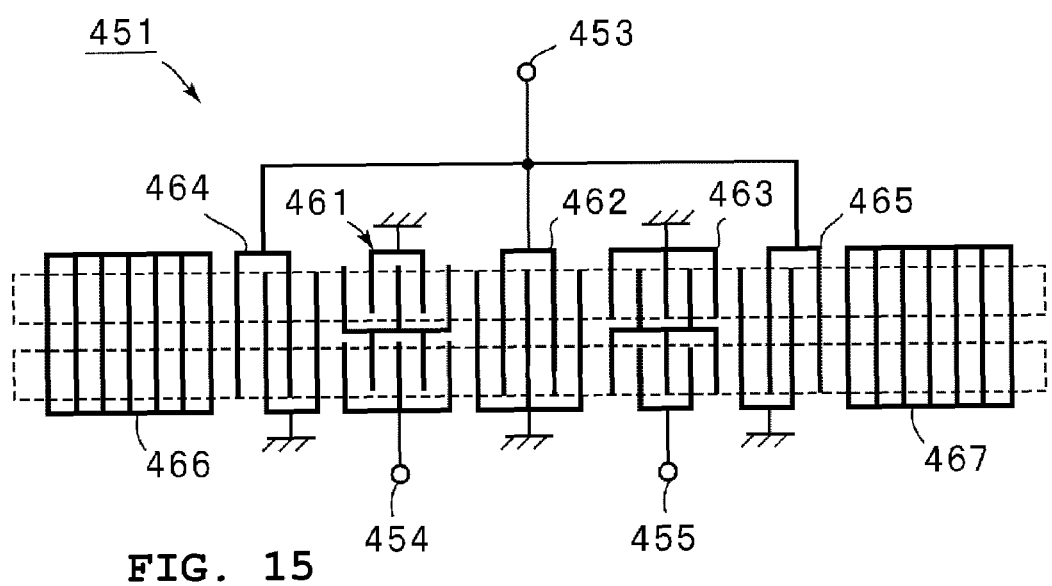
FIG. 14 is a schematic plan view of the electrode structure of an acoustic wave filter device according to a sixth preferred embodiment of the present invention.

FIG. 14 is a schematic plan view of the electrode structure of a surface acoustic wave filter device according to a sixth preferred embodiment of the present invention.

In a surface acoustic wave filter device 451, first to third IDTs 461 to 463 are arranged in the surface wave propagating direction. The IDTs 461 to 463 are configured in the same manner as the IDTs 411 to 413 shown in FIG. 13 except that the numbers of electrode fingers are different.

Additionally, in this preferred embodiment, fourth and fifth IDTs 464 and 465 are arranged on either side of the first to third IDTs 461 to 463 which are arranged in the surface wave propagating direction. Also, reflectors 466 and 467 are arranged on either side of an area in which the first to fifth IDTs 461 to 465 are arranged. One end of the fourth IDT 464 and one end of the fifth IDT 465 are commonly connected and are connected to an unbalanced terminal 453. One end of the first IDT 461 is connected to a balanced terminal 454 and one end of the third IDT 463 is connected to a balanced terminal 455. The other structure of the acoustic wave filter device 451 is substantially the same as that of the acoustic wave filter device 401. In this preferred embodiment, by adjusting the excitation strength on the first acoustic track to be substantially the same as that on the second acoustic track, as in the surface acoustic wave filter device 401, that is, by relatively reducing the metallization ratio on the first acoustic track, a ripple that tends to occur in the passband is efficiently eliminated.

The surface acoustic wave filter devices according to the above-described preferred embodiments and modifications utilize surface acoustic waves as acoustic waves. However, according to the present invention, the acoustic waves are not limited to surface acoustic waves. Alternatively, another type of acoustic waves, such as boundary acoustic waves, may be utilized. In an acoustic wave filter device using another type of acoustic waves, by using the structure of the IDTs according to the present invention, a balanced-unbalanced conversion function and a high-ratio impedance conversion function are provided.

Figure 15:
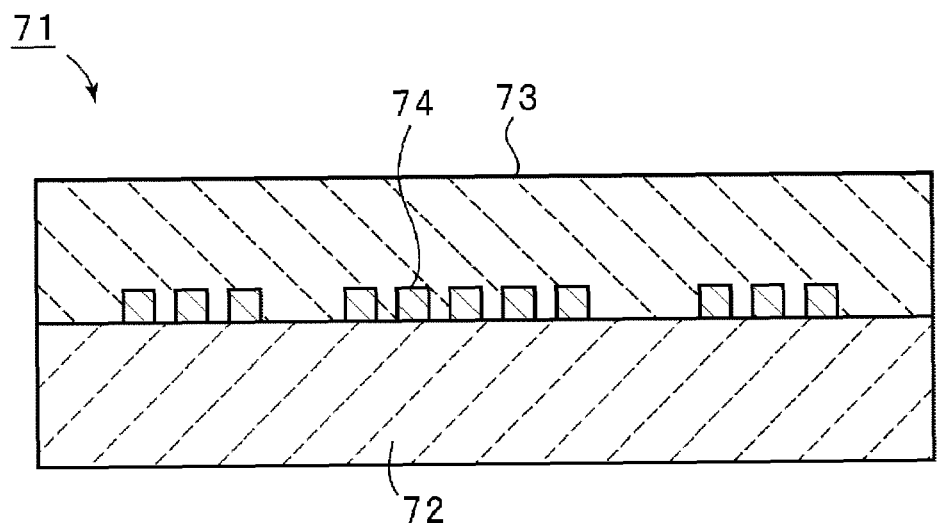
FIG. 15 is a schematic front sectional view of the electrode structure of a boundary acoustic wave filter device to which the present invention is applied.
Figure 16:
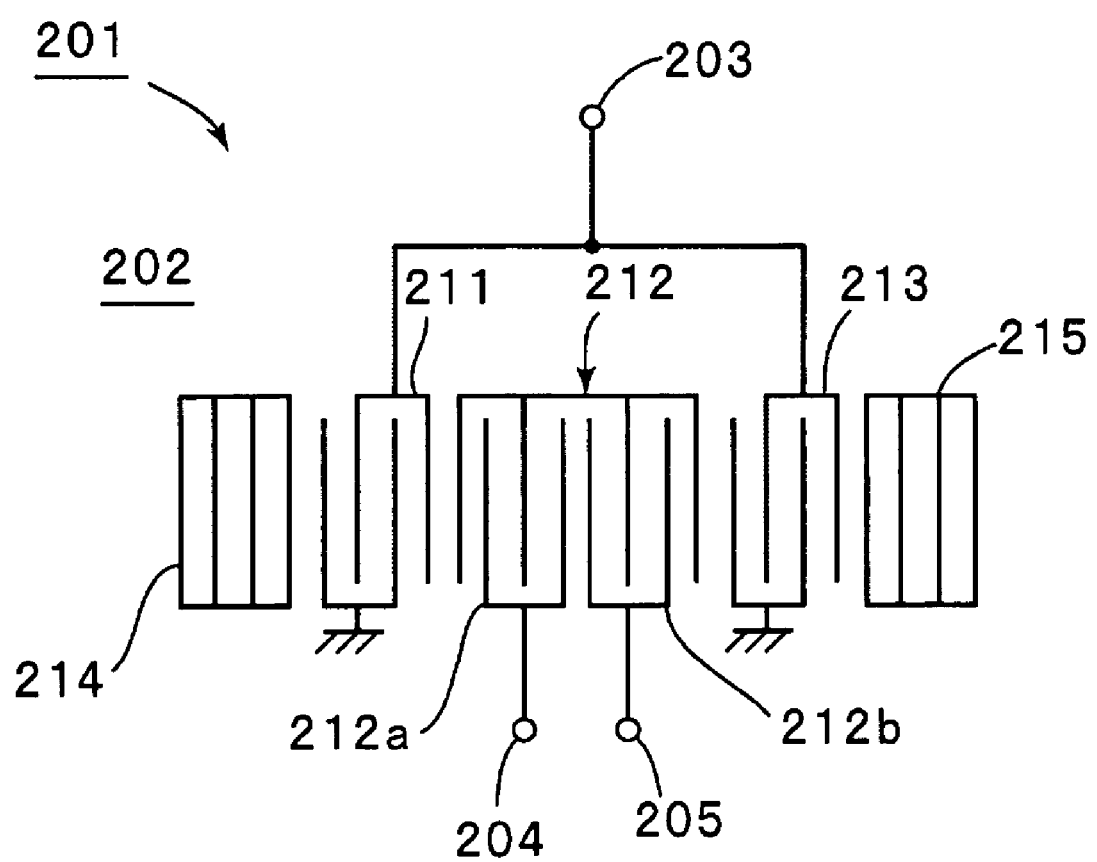
FIG. 16 is a schematic plan view of an exemplary known surface acoustic wave filter device having a balanced-unbalanced conversion function.

FIG. 15 is a schematic front sectional view of the electrode structure of a boundary acoustic wave filter device. In a boundary acoustic wave filter device 71, a piezoelectric substrate 72 defining a first medium layer and a dielectric material 73 defining a second medium layer are laminated. An electrode 74 including a plurality of IDTs is provided on the boundary between the piezoelectric substrate 72 and the dielectric material 73. By using boundary acoustic waves propagating in the boundary, a filter characteristic is obtained. In this case, by providing the boundary acoustic wave filter device 71 including the electrode 74 having an electrode structure that is substantially the same as that of the surface acoustic wave filter according to the above-described preferred embodiments, an acoustic wave filter device according to the present invention is achieved.

The acoustic wave filter device according to preferred embodiments of the present invention can be effectively used for a bandpass filter disposed between an antenna and a differential amplifier of the above-described mobile communication apparatus. However, the acoustic wave filter device according to preferred embodiments of the present invention is not limited to such an application. That is, the acoustic wave filter device according to preferred embodiments of the present invention can be widely used for a filter device required to provide both a balanced-unbalanced conversion function and an impedance conversion function.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A balanced acoustic wave filter device having an unbalanced terminal and first and second balanced terminals and having a balanced-unbalanced conversion function, comprising:

a piezoelectric substrate; and first, second and third IDTs disposed on the piezoelectric substrate in a surface wave propagating direction; wherein the second IDT includes first and second divided IDT portions obtained by dividing the second IDT into two in the surface wave propagating direction;

one end of the first divided IDT portion is connected to one end of the second divided IDT portion such that the first divided IDT portion is connected to the second divided IDT portion in series;

the other end of the first divided IDT portion is connected to the first balanced terminal, and the other end of the second divided IDT portion is connected to the second balanced terminal;

the first, second and third IDTs are arranged such that electrical signals flowing from the unbalanced terminal to the first balanced terminal and flowing from the unbalanced terminal to the second balanced terminal have a 180-degree phase difference;

each of the first and second divided IDT portions includes at least first and second sub-divided IDT portions obtained by dividing each of the first and second divided IDT portions in a crossing width direction that is substantially perpendicular to the surface wave propagating direction; and at least the first and second sub-divided IDT portions are electrically connected in series.

2. The balanced acoustic wave filter device according to claim 1, wherein the outermost electrode fingers of the first and third IDTs adjacent to the second IDT are connected to ground.

3. The balanced acoustic wave filter device according to claim 1, wherein the second sub-divided IDT portion of the first divided IDT portion is connected to the first balanced terminal, and the second sub-divided IDT portion of the second divided IDT portion is connected to the second balanced terminal;

the balanced acoustic wave filter device further includes a first acoustic track allowing acoustic waves to propagate in the first sub-divided IDT portion and a second acoustic track allowing acoustic waves to propagate in the second sub-divided IDT portion; and means for adjusting the excitation strength of acoustic waves propagating on the first acoustic track to be substantially the same as the excitation strength of acoustic waves propagating on the second acoustic track.

4. The balanced acoustic wave filter device according to claim 3, wherein the means for adjusting the excitation strength of acoustic waves propagating on the first acoustic track to be substantially the same as the excitation strength of acoustic waves propagating on the second acoustic track includes at least one of means for changing the excitation strength of acoustic waves propagating on the first acoustic track and means for changing the excitation strength of acoustic waves propagating on the second acoustic track.

5. The balanced acoustic wave filter device according to claim 4, wherein the means for changing the excitation strength on the first acoustic track includes at least one of means for changing the excitation strength in a gap between the first sub-divided IDT portions and means for changing the excitation strength in a gap between the outer edge of the first sub-divided IDT portion in the surface wave propagating direction and the adjacent IDT.

6. The balanced acoustic wave filter device according to claim 4, wherein the means for changing the excitation strength on the second acoustic track includes at least one of means for changing the excitation strength in a gap between the second sub-divided IDT portions and means for changing the excitation strength in a gap between the outer edge of the second sub-divided IDT portion in the surface wave propagating direction and the adjacent IDT.

7. The balanced acoustic wave filter device according to claim 3, wherein the means for adjusting the excitation strength on the first acoustic track to be substantially the same as the excitation strength on the second acoustic track includes means for weighting an IDT.

8. The balanced acoustic wave filter device according to claim 7, wherein the weighting includes one of series weighting, thinning-out weighting, and crossing width weighting.

9. The balanced acoustic wave filter device according to claim 3, wherein
   each of the first and second sub-divided IDT portions includes a narrow-pitch electrode finger portion, the narrow-pitch electrode finger portion includes a plurality of electrode fingers starting from an electrode finger adjacent to another IDT, and a cycle of the electrode fingers in the narrow-pitch electrode finger portion is less than a cycle of electrode fingers in a portion other than the narrow-pitch electrode finger portion; and
   when the portion of the IDT other than the narrow-pitch electrode finger portion is referred to as a main portion, the means for adjusting the excitation strength on the first acoustic track includes at least one of means for adjusting the excitation strength in the narrow-pitch electrode finger portion and means for adjusting the excitation strength in the main portion.

10. The balanced acoustic wave filter device according to claim 9, wherein the means includes a metallization ratio of electrode fingers.

11. The balanced acoustic wave filter device according to claim 10, wherein the metallization ratio of electrode fingers on the first acoustic track is less than the metallization ratio of electrode fingers on the second acoustic track.

12. A balanced acoustic wave filter device having an unbalanced terminal and first and second balanced terminals and having a balanced-unbalanced conversion function, comprising:
   a piezoelectric substrate; and
   first and second longitudinally coupled resonator type acoustic wave filter portions provided on the piezoelectric substrate; wherein
   the first acoustic wave filter portion includes first, second and third IDTs disposed in the acoustic wave propagating direction and the second acoustic wave filter portion includes fourth, fifth and sixth IDTs disposed in a surface wave propagating direction;
   the second IDT of the first acoustic wave filter portion is connected to the unbalanced terminal;
   the fourth IDT of the second acoustic wave filter portion is connected to the first IDT by a first interconnection line;
   the third IDT is connected to the sixth IDT of the second acoustic wave filter portion by a second interconnection line;
   the fifth IDT includes first and second divided IDT portions obtained by dividing the fifth IDT in the acoustic wave propagating direction;
   one end of the first divided IDT portion is connected to one end of the second divided IDT portion in series;
   the other end of the first divided IDT portion is electrically connected to the first balanced terminal, and the other end of the second divided IDT portion is electrically connected to the second balanced terminal;
   the second IDT and the first and third IDTs are arranged such that electrical signals flowing in the first interconnection line and flowing in the second interconnection line have a 180-degree phase difference;
   each of the first and second divided IDT portions of the second acoustic wave filter portion includes at least first and second sub-divided IDT portions obtained by further dividing each of the first and second divided IDT portions in a crossing width direction that is substantially perpendicular to the acoustic wave propagating direction; and
   at least the first and second sub-divided IDT portions are electrically connected in series.

13. The balanced acoustic wave filter device according to claim 12, wherein the outermost electrode fingers of the fourth and sixth IDTs adjacent to the fifth IDT are connected to ground.

14. The balanced acoustic wave filter device according to claim 12, wherein
   the second sub-divided IDT portion of the first divided IDT portion is connected to the first balanced terminal, and the second sub-divided IDT portion of the second divided IDT portion is connected to the second balanced terminal;
   the balanced acoustic wave filter device further includes a first acoustic track allowing acoustic waves to propagate in the first sub-divided IDT portion and a second acoustic track allowing acoustic waves to propagate in the second sub-divided IDT portion; and
   means for adjusting the excitation strength of acoustic waves propagating on the first acoustic track to be substantially the same as the excitation strength of acoustic waves propagating on the second acoustic track.

15. The balanced acoustic wave filter device according to claim 14, wherein the means for adjusting the excitation strength of acoustic waves propagating on the first acoustic track to be substantially the same as the excitation strength of acoustic waves propagating on the second acoustic track includes at least one of means for changing the excitation strength of acoustic waves propagating on the first acoustic track and means for changing the excitation strength of acoustic waves propagating on the second acoustic track.

16. The balanced acoustic wave filter device according to claim 15, wherein the means for changing the excitation strength on the first acoustic track includes at least one of means for changing the excitation strength in a gap between the first sub-divided IDT portions and means for changing the excitation strength in a gap between the outer edge of the first sub-divided IDT portion in the surface wave propagating direction and the adjacent IDT.

17. The balanced acoustic wave filter device according to claim 15, wherein the means for changing the excitation strength on the second acoustic track includes at least one of means for changing the excitation strength in a gap between the second sub-divided IDT portions and means for changing the excitation strength in a gap between the outer edge of the second sub-divided IDT portion in the surface wave propagating direction and the adjacent IDT.

18. The balanced acoustic wave filter device according to claim 14, wherein the means for adjusting the excitation strength on the first acoustic track to be substantially the same as the excitation strength on the second acoustic track includes means for weighting an IDT.

19. The balanced acoustic wave filter device according to claim 18, wherein the weighting includes one of series weighting, thinning-out weighting, and crossing width weighting.

20. The balanced acoustic wave filter device according to claim 14, wherein each of the first and second sub-divided IDT portions includes a narrow-pitch electrode finger portion, the narrow-pitch electrode finger portion includes a plurality of electrode fingers starting from an electrode finger adjacent to another IDT, and a cycle of the electrode fingers in the narrow-pitch electrode finger portion is less than a cycle of electrode fingers in a portion other than the narrow-pitch electrode finger portion; and when the portion of the IDT other than the narrow-pitch electrode finger portion is referred to as a main portion, the means for adjusting the excitation strength on the first acoustic track includes at least one of means for adjusting the excitation strength in the narrow-pitch electrode finger portion and means for adjusting the excitation strength in the main portion.

21. The balanced acoustic wave filter device according to claim 20, wherein the means includes a metallization ratio of electrode fingers.

22. The balanced acoustic wave filter device according to claim 21, wherein the metallization ratio of electrode fingers on the first acoustic track is less than the metallization ratio of electrode fingers on the second acoustic track.

23. A balanced acoustic wave filter device having first and second balanced terminals and third and fourth balanced terminals, comprising:

a piezoelectric substrate; and first, second and third IDTs disposed on the piezoelectric substrate in a surface wave propagating direction; wherein the second IDT includes first and second divided IDT portions obtained by dividing the second IDT in the surface wave propagating direction;

one end of the first divided IDT portion is connected to one end of the second divided IDT portion such that the first divided IDT portion is connected to the second divided IDT portion in series;

the other end of the first divided IDT portion is connected to the first balanced terminal, and the other end of the second divided IDT portion is connected to the second balanced terminal;

the third balanced terminal is connected to the first IDT and the fourth balanced terminal is connected to the third IDT;

each of the first and second divided IDT portions includes at least first and second sub-divided IDT portions obtained by further dividing each of the first and second divided IDT portions in a crossing width direction that is substantially perpendicular to the surface wave propagating direction; and at least the first and second sub-divided IDT portions are electrically connected in series.

24. The balanced acoustic wave filter device according to claim 23, wherein the outermost electrode fingers of the first and third IDTs adjacent to the second IDT are connected to ground.

25. The balanced acoustic wave filter device according to claim 23, wherein the second sub-divided IDT portion of the first divided IDT portion is connected to the first balanced terminal, and the second sub-divided IDT portion of the second divided IDT portion is connected to the second balanced terminal;

the balanced acoustic wave filter device further includes:
a first acoustic track allowing acoustic waves to propagate in the first sub-divided IDT portion and a second acoustic track allowing acoustic waves to propagate in the second sub-divided IDT portion; and means for adjusting the excitation strength of acoustic waves propagating on the first acoustic track to be substantially the same as the excitation strength of acoustic waves propagating on the second acoustic track.

26. The balanced acoustic wave filter device according to claim 25, wherein the means for adjusting the excitation strength of acoustic waves propagating on the first acoustic track to be substantially the same as the excitation strength of acoustic waves propagating on the second acoustic track includes at least one of means for changing the excitation strength of acoustic waves propagating on the first acoustic track and means for changing the excitation strength of acoustic waves propagating on the second acoustic track.

27. The balanced acoustic wave filter device according to claim 26, wherein the means for changing the excitation strength on the first acoustic track includes at least one of means for changing the excitation strength in a gap between the first sub-divided IDT portions and means for changing the excitation strength in a gap between the outer edge of the first sub-divided IDT portion in the surface wave propagating direction and the adjacent IDT.

28. The balanced acoustic wave filter device according to claim 26, wherein the means for changing the excitation strength on the second acoustic track includes at least one of means for changing the excitation strength in a gap between the second sub-divided IDT portions and means for changing the excitation strength in a gap between the outer edge of the second sub-divided IDT portion in the surface wave propagating direction and the adjacent IDT.

29. The balanced acoustic wave filter device according to claim 25, wherein the means for adjusting the excitation strength on the first acoustic track to be substantially the same as the excitation strength on the second acoustic track includes means for weighting an IDT.

30. The balanced acoustic wave filter device according to claim 29, wherein the weighting includes one of series weighting, thinning-out weighting, and crossing width weighting.

31. The balanced acoustic wave filter device according to claim 25, wherein each of the first and second sub-divided IDT portions includes a narrow-pitch electrode finger portion, the narrow-pitch electrode finger portion includes a plurality of electrode fingers starting from an electrode finger adjacent to another IDT, and a cycle of the electrode fingers in the narrow-pitch electrode finger portion is less than a cycle of electrode fingers in a portion other than the narrow-pitch electrode finger portion; and when the portion of the IDT other than the narrow-pitch electrode finger portion is referred to as a main portion, the means for adjusting the excitation strength on the first acoustic track includes at least one of means for adjusting the excitation strength in the narrow-pitch electrode finger portion and means for adjusting the excitation strength in the main portion.

32. The balanced acoustic wave filter device according to claim 31, wherein the means includes a metallization ratio of electrode fingers.

33. The balanced acoustic wave filter device according to claim 32, wherein the metallization ratio of electrode fingers on the first acoustic track is less than the metallization ratio of electrode fingers on the second acoustic track.

34. A balanced acoustic wave filter device having an unbalanced terminal and first and second balanced terminals and having a balanced-unbalanced conversion function, comprising:
- a piezoelectric substrate; and
- first, second and third IDTs disposed on the piezoelectric substrate in a surface wave propagating direction; wherein
- the second IDT is connected to the unbalanced terminal;
- one end of the first IDT is connected to the first balanced terminal, and one end of the third IDT is connected to the second balanced terminal;
- the first, second and third IDTs are arranged such that electrical signals flowing from the unbalanced terminal to the first balanced terminal and flowing from the unbalanced terminal to the second balanced terminal have a 180-degree phase difference;
- each of the first and third IDTs includes at least first and second sub-divided IDT portions obtained by dividing each of the first and third divided IDTs into two in a crossing width direction that is substantially perpendicular to the surface wave propagating direction, and at least the first and second sub-divided IDT portions are electrically connected in series;
- the second sub-divided IDT portion of the first IDT is connected to the first balanced terminal, and the second sub-divided IDT portion of the third IDT is connected to the second balanced terminal;
- the balanced acoustic wave filter device further includes:
- a first acoustic track allowing acoustic waves to propagate in the first sub-divided IDT portion;
- a second acoustic track allowing acoustic waves to propagate in the second sub-divided IDT portion;
- means for adjusting excitation strength of acoustic waves propagating on the first acoustic track to be substantially the same as excitation strength of acoustic waves propagating on the second acoustic track; and
- the means for adjusting the excitation strength of acoustic waves propagating on the first acoustic track to be substantially the same as the excitation strength of acoustic waves propagating on the second acoustic track includes at least one of means for changing the excitation strength of acoustic waves propagating on the first acoustic track and means for changing the excitation strength of acoustic waves propagating on the second acoustic track.

35. The balanced acoustic wave filter device according to claim 34, wherein a portion at which one end of the first IDT is connected to one end of the third IDT is connected to ground.

36. The balanced acoustic wave filter device according to claim 34, further comprising:
- a fourth IDT disposed outside the first IDT and connected to an unbalanced terminal; and
- a fifth IDT disposed outside the third IDT and connected to an unbalanced terminal.

37. The balanced acoustic wave filter device according to claim 34, wherein the outermost electrode fingers of the second IDT adjacent to the first and third IDTs are connected to ground.

38. The balanced acoustic wave filter device according to claim 36, wherein the outermost electrode fingers of the fourth and fifth IDTs adjacent to the first and third IDTs are connected to ground.

39. The balanced acoustic wave filter device according to claim 34, wherein the means for changing the excitation strength on the first acoustic track includes at least one of means for changing the excitation strength in a gap between the first sub-divided IDT portions and means for changing the excitation strength in a gap between the outer edge of the first sub-divided IDT portion in the surface wave propagating direction and the adjacent IDT.

40. The balanced acoustic wave filter device according to claim 34, wherein the means for changing the excitation strength on the second acoustic track includes at least one of means for changing the excitation strength in a gap between the second sub-divided IDT portions and means for changing the excitation strength in a gap between the outer edge of the second sub-divided IDT portion in the surface wave propagating direction and the adjacent IDT.

41. A balanced acoustic wave filter device having an unbalanced terminal and first and second balanced terminals and having a balanced-unbalanced conversion function, comprising:
- a piezoelectric substrate; and
- first, second and third IDTs disposed on the piezoelectric substrate in a surface wave propagating direction; wherein
- the second IDT is connected to the unbalanced terminal;
- one end of the first IDT is connected to the first balanced terminal, and one end of the third IDT is connected to the second balanced terminal;
- the first, second and third IDTs are arranged such that electrical signals flowing from the unbalanced terminal to the first balanced terminal and flowing from the unbalanced terminal to the second balanced terminal have a 180-degree phase difference;
- each of the first and third IDTs includes at least first and second sub-divided IDT portions obtained by dividing each of the first and third divided IDTs into two in a crossing width direction that is substantially perpendicular to the surface wave propagating direction, and at least the first and second sub-divided IDT portions are electrically connected in series;
- the second sub-divided IDT portion of the first IDT is connected to the first balanced terminal, and the second sub-divided IDT portion of the third IDT is connected to the second balanced terminal;
- the balanced acoustic wave filter device further includes:
- a first acoustic track allowing acoustic waves to propagate in the first sub-divided IDT portion;
- a second acoustic track allowing acoustic waves to propagate in the second sub-divided IDT portion;
- means for adjusting excitation strength of acoustic waves propagating on the first acoustic track to be substantially the same as excitation strength of acoustic waves propagating on the second acoustic track; and
- the means for adjusting the excitation strength on the first acoustic track to be substantially the same as the excitation strength on the second acoustic track includes means for weighting an IDT.

42. The balanced acoustic wave filter device according to claim 41, wherein the weighting includes one of series weighting, thinning-out weighting, and crossing width weighting.

43. A balanced acoustic wave filter device having an unbalanced terminal and first and second balanced terminals and having a balanced-unbalanced conversion function, comprising:
- a piezoelectric substrate; and
- first, second and third IDTs disposed on the piezoelectric substrate in a surface wave propagating direction; wherein
- the second IDT is connected to the unbalanced terminal;

one end of the first IDT is connected to the first balanced terminal, and one end of the third IDT is connected to the second balanced terminal;

the first, second and third IDTs are arranged such that electrical signals flowing from the unbalanced terminal to the first balanced terminal and flowing from the unbalanced terminal to the second balanced terminal have a 180-degree phase difference;

each of the first and third IDTs includes at least first and second sub-divided IDT portions obtained by dividing each of the first and third divided IDTs into two in a crossing width direction that is substantially perpendicular to the surface wave propagating direction, and at least the first and second sub-divided IDT portions are electrically connected in series;

the second sub-divided IDT portion of the first IDT is connected to the first balanced terminal, and the second sub-divided IDT portion of the third IDT is connected to the second balanced terminal;

the balanced acoustic wave filter device further includes:

a first acoustic track allowing acoustic waves to propagate in the first sub-divided IDT portion, a second acoustic track allowing acoustic waves to propagate in the second sub-divided IDT portion;

means for adjusting excitation strength of acoustic waves propagating on the first acoustic track to be substantially the same as excitation strength of acoustic waves propagating on the second acoustic track;

each of the first and second sub-divided IDT portions includes a narrow-pitch electrode finger portion, the narrow-pitch electrode finger portion includes a plurality of electrode fingers starting from an electrode finger adjacent to another IDT, and a cycle of the electrode fingers in the narrow-pitch electrode finger portion is less than a cycle of electrode fingers a portion other than the narrow-pitch electrode finger portion; and when the portion of the IDT other than the narrow-pitch electrode finger portion is referred to as a main portion, the means for adjusting the excitation strength on the first acoustic track includes at least one of means for adjusting the excitation strength in the narrow-pitch electrode finger portion and means for adjusting the excitation strength in the main portion.

44. The balanced acoustic wave filter device according to claim 43, wherein the means includes a metallization ratio of electrode fingers.

45. The balanced acoustic wave filter device according to claim 44, wherein the metallization ratio of electrode fingers on the first acoustic track is less than the metallization ratio of electrode fingers on the second acoustic track.

46. The balanced acoustic wave filter device according to claim 41, wherein a portion at which one end of the first IDT is connected to one end of the third IDT is connected to ground.

47. The balanced acoustic wave filter device according to claim 41, further comprising:

a fourth IDT disposed outside the first IDT and connected to an unbalanced terminal; and a fifth IDT disposed outside the third IDT and connected to an unbalanced terminal.

48. The balanced acoustic wave filter device according to claim 41, wherein the outermost electrode fingers of the second IDT adjacent to the first and third IDTs are connected to ground.

49. The balanced acoustic wave filter device according to claim 47, wherein the outermost electrode fingers of the fourth and fifth IDTs adjacent to the first and third IDTs are connected to ground.

50. The balanced acoustic wave filter device according to claim 43, wherein a portion at which one end of the first IDT is connected to one end of the third IDT is connected to ground.

51. The balanced acoustic wave filter device according to claim 43, further comprising:

a fourth IDT disposed outside the first IDT and connected to an unbalanced terminal; and a fifth IDT disposed outside the third IDT and connected to an unbalanced terminal.

52. The balanced acoustic wave filter device according to claim 43, wherein the outermost electrode fingers of the second IDT adjacent to the first and third IDTs are connected to ground.

53. The balanced acoustic wave filter device according to claim 51, wherein the outermost electrode fingers of the fourth and fifth IDTs adjacent to the first and third IDTs are connected to ground.

* * * * *